(12) United States Patent
Komazaki

(10) Patent No.: US 7,242,271 B2
(45) Date of Patent: Jul. 10, 2007

(54) SAW FILTER CIRCUIT

(75) Inventor: Tomokazu Komazaki, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 56 days.

(21) Appl. No.: 11/066,300

(22) Filed: Feb. 28, 2005

(65) Prior Publication Data

US 2005/0190015 A1    Sep. 1, 2005

(30) Foreign Application Priority Data

Feb. 27, 2004   (JP) .............................. 2004-055249
Jun. 21, 2004   (JP) .............................. 2004-182787

(51) Int. Cl.
*H03H 9/00*   (2006.01)
*H03H 9/206*   (2006.01)

(52) U.S. Cl. ...................... 333/193; 333/195

(58) Field of Classification Search ................ 333/133, 333/193, 194, 195, 196
See application file for complete search history.

(56) References Cited

U.S. PATENT DOCUMENTS 5,499,002 A * 3/1996 Kinsman ..................... 333/187
6,677,835 B2   1/2004 Noguchi et al.
6,903,631 B2 * 6/2005 Kushitani et al. ........... 333/193

FOREIGN PATENT DOCUMENTS

JP       10-93382       4/1998
JP       2002-208835    7/2002
JP       2003-101384    4/2003

OTHER PUBLICATIONS

Satoh et al., "A Low-Loss Band-Pass Filter Using SAW Resonators," Denshi Jouhou Tsuushin Gakukai Ronbunshi, Feb. 1993, pp. 245-251, vol. J76-A, Japan.

* cited by examiner

*Primary Examiner*—Dean Takaoka
(74) *Attorney, Agent, or Firm*—Volentine & Whitt, PLLC

(57) ABSTRACT

A SAW filter circuit has: a first circuit having first to fourth connecting points, a first SAW resonator electrically connected to the first and second connecting points, second SAW resonator electrically connected to the first and third connecting points, and third SAW resonator electrically connected to the second and fourth connecting points; and a second circuit made of a fifth connecting point electrically connected to the third connecting point, a sixth connecting point electrically connected to the fourth connecting point, seventh and eighth connecting points being electrically short-circuited, a first passive element electrically connected to the fifth and sixth connecting points, a second passive element electrically connected to the fifth and seventh connecting points, and a third passive element electrically connected to the sixth and eighth connecting points. Each passive elements is an inductor or capacitor, and at least one of the first to third passive elements is a capacitor.

24 Claims, 34 Drawing Sheets

Fig. 5

|  | SR1 | PR1 | PR2 |
|---|---|---|---|
| CROSS LENGTH (μm) | 70 | 60 | 60 |
| NUMBER OF PAIRS | 70 | 80 | 80 |

Fig. 6

FIRST EMBODIMENT

| No. | 1 | 2 | 3 | 4 | COMPARATIVE EXAMPLE |
|---|---|---|---|---|---|
| L1 (nH) | 0.6 | 0.4 | 1.0 | 0.2 | L1=0.2(nH) |
| C2 (pF) | 70.0 | 55.0 | 22.0 | 105.0 | L2=0.2(nH) |
| L3 (nH) | 0.6 | 0.2 | 0.2 | 0.2 | L3=0.2(nH) |
| 20dB(-) (GHz) | 855.2 | 855.8 | 855.5 | 855.2 | 859 |
| 20dB(+) (GHz) | 870 | 870.7 | 871 | 870.2 | 873.4 |
| 3dB(-) (GHz) | 876.7 | 876.8 | 876.8 | 876.8 | 877 |
| 3dB(+) (GHz) | 926.5 | 926.5 | 926.5 | 926.5 | 926.7 |
| 20dB BAND WIDTH (GHz) | 14.8 | 14.9 | 15.5 | 15 | 12 |
| 3dB BAND WIDTH (GHz) | 49.8 | 49.7 | 49.7 | 49.7 | 49.7 |

Fig. 11

SECOND EMBODIMENT

| NO | 1 | 2 | 3 | 4 | COMPARATIVE EXAMPLE |
|---|---|---|---|---|---|
| L1 (nH) | 1.0 | 0.7 | 0.1 | 0.2 | L1=0.2 (nH) |
| C2 (pF) | 700.0 | 610.0 | 800.0 | 600.0 | L2=0.2 (nH) |
| C3 (pF) | 600.0 | 750.0 | 550.0 | 600.0 | L3=0.2 (nH) |
| 20dB(-) (GHz) | 857.3 | 856.5 | 856.5 | 858.5 | 859 |
| 20dB(+) (GHz) | 871 | 871 | 870.5 | 871 | 871 |
| 3dB(-) (GHz) | 876.8 | 876.8 | 876.8 | 876.8 | 877 |
| 3dB(+) (GHz) | 926.3 | 926.3 | 926.3 | 926.3 | 926.7 |
| 20dB BAND WIDTH (GHz) | 13.7 | 14.5 | 14 | 12.5 | 12 |
| 3dB BAND WIDTH (GHz) | 49.5 | 49.5 | 49.5 | 49.5 | 49.7 |

Fig. 15

THIRD EMBODIMENT

| NO | 1 | 2 | 3 | 4 | COMPARATIVE EXAMPLE |
|---|---|---|---|---|---|
| L1 (nH) | 0.5 | 0.4 | 0.2 | 0.1 | L1=0.2(nH) |
| L2 (nH) | 0.5 | 0.4 | 0.2 | 0.1 | L2=0.2(nH) |
| C3 (pF) | 1.0 | 5.0 | 45.0 | 90.0 | L3=0.2(nH) |
| 20dB(-) (GHz) | 855.6 | 856.3 | 856.7 | 859 | 859 |
| 20dB(+) (GHz) | 870 | 870.5 | 870.7 | 871.2 | 871 |
| 3dB(-) (GHz) | 876.8 | 876.8 | 876.8 | 876.8 | 877 |
| 3dB(+) (GHz) | 926.5 | 926.5 | 926.5 | 926.5 | 926.7 |
| 20dB BAND WIDTH (GHz) | 14.4 | 14.2 | 14 | 12.2 | 12 |
| 3dB BAND WIDTH (GHz) | 49.7 | 49.7 | 49.7 | 49.7 | 49.7 |

THIRD EMBODIMENT

Fig. 19

FOURTH EMBODIMENT

| NO | 1 | 2 | 3 | 4 | COMPARATIVE EXAMPLE |
|---|---|---|---|---|---|
| C1 (pF) | 500.0 | 700.0 | 68.0 | 110.0 | L1=0.2 (nH) |
| L2 (nH) | 0.3 | 0.3 | 1.5 | 0.8 | L2=0.2 (nH) |
| C3 (pF) | 170.0 | 160.0 | 70.0 | 110.0 | L3=0.2 (nH) |
| 20dB(-) (GHz) | 854.4 | 857.3 | 854.8 | 854 | 859 |
| 20dB(+) (GHz) | 870.7 | 871 | 870.4 | 870 | 871 |
| 3dB(-) (GHz) | 876.8 | 876.8 | 876.8 | 876.8 | 877 |
| 3dB(+) (GHz) | 926.5 | 926.5 | 926.5 | 926.5 | 926.7 |
| 20dB BAND WIDTH (GHz) | 16.3 | 13.7 | 15.6 | 16 | 12 |
| 3dB BAND WIDTH (GHz) | 49.7 | 49.7 | 49.7 | 49.7 | 49.7 |

Fig. 24

|  | SR1 | SR2 | SR3 | PR1 | PR2 |
|---|---|---|---|---|---|
| CROSS LENGTH ($\mu$m) | 600 | 120 | 120 | 80 | 80 |
| NUMBER OF PAIRS | 80 | 80 | 80 | 100 | 100 |

Fig. 25

FIFTH EMBODIMENT

| NO | 1 | 2 | 3 | 4 | 5 | 6 | 7 | COMPARATIVE EXAMPLE |
|---|---|---|---|---|---|---|---|---|
| L1 (nH) | 0.4 | 0.5 | 1.0 | 1.5 | 3.0 | 4.0 | 2.0 | L1=2 (nH) |
| C2 (pF) | 55.0 | 55.0 | 30.0 | 22.0 | 18.0 | 22.0 | 22.0 | L2=2 (nH) |
| L3 (nH) | 0.4 | 0.5 | 1.0 | 1.5 | 3.0 | 4.0 | 2.0 | L3=2 (nH) |
| 30dB (−) (GHz) | 881.1 | 881.1 | 881.2 | 881.3 | 881.4 | 881.5 | 881.3 | 881.0 |
| 30dB (+) (GHz) | 900.1 | 899.8 | 903.4 | 910.5 | 982.4 | 962.4 | 918.9 | 898.6 |
| 3dB (−) (GHz) | 827.6 | 827.7 | 827.5 | 827.3 | 827.2 | 827.2 | 827.3 | 827.8 |
| 3dB (+) (GHz) | 873.9 | 874.0 | 873.9 | 873.9 | 873.6 | 873.3 | 873.8 | 874.0 |
| 30dB BAND WIDTH (GHz) | 19.1 | 18.7 | 22.2 | 29.3 | 101.0 | 80.9 | 37.6 | 17.6 |
| 3dB BAND WIDTH (GHz) | 46.3 | 46.3 | 46.5 | 46.6 | 46.4 | 46.0 | 46.5 | 46.2 |

Fig. 29

SIXTH EMBODIMENT

| NO | 1 | 2 | 3 | 4 | 5 | 6 | 7 | COMPARATIVE EXAMPLE |
|---|---|---|---|---|---|---|---|---|
| L1 (nH) | 0.3 | 2.5 | 2.2 | 3.0 | 0.4 | 0.5 | 0.3 | L1=2 (nH) |
| C2 (pF) | 130.0 | 11.7 | 15.0 | 96.0 | 85.0 | 67.0 | 115.0 | L2=2 (nH) |
| C3 (pF) | 700.0 | 120.0 | 130.0 | 100.0 | 400.0 | 350.0 | 500.0 | L3=2 (nH) |
| 30dB (−) (GHz) | 880.9 | 881.2 | 881.2 | 881.2 | 881.0 | 881.0 | 881.0 | 881.0 |
| 30dB (+) (GHz) | 897.3 | 935.3 | 933.6 | 935.0 | 899.6 | 900.8 | 898.5 | 898.6 |
| 3dB (−) (GHz) | 828.6 | 828.3 | 828.3 | 828.3 | 828.4 | 828.4 | 828.5 | 827.8 |
| 3dB (+) (GHz) | 873.7 | 872.3 | 872.5 | 872.2 | 873.4 | 873.3 | 873.6 | 874.0 |
| 30dB BAND WIDTH (GHz) | 16.4 | 54.1 | 52.4 | 53.7 | 18.6 | 19.7 | 17.5 | 17.6 |
| 3dB BAND WIDTH (GHz) | 45.2 | 44.0 | 44.2 | 43.9 | 45.0 | 44.9 | 45.1 | 46.2 |

Fig. 33

| SEVENTH EMBODIMENT | | | | | | | | COMPARATIVE EXAMPLE |
|---|---|---|---|---|---|---|---|---|
| NO | 1 | 2 | 3 | 4 | 5 | 6 | 7 | |
| L1 (nH) | 2.0 | 0.4 | 0.3 | 1.5 | 1.0 | 0.7 | 0.5 | L1=2 (nH) |
| L2 (nH) | 0.1 | 0.1 | 0.1 | 0.1 | 0.1 | 0.1 | 0.1 | L2=2 (nH) |
| C3 (pF) | 2.0 | 57.0 | 60.0 | 6.0 | 16.0 | 29.0 | 44.0 | L3=2 (nH) |
| 30dB (−) (GHz) | 881.4 | 881.2 | 881.1 | 881.4 | 881.3 | 881.3 | 881.3 | 881.0 |
| 30dB (+) (GHz) | 961.7 | 948.6 | 906.8 | 945.3 | 955.5 | 943.1 | 947.7 | 898.6 |
| 3dB (−) (GHz) | 827.4 | 827.6 | 826.4 | 827.4 | 827.4 | 827.5 | 827.6 | 827.8 |
| 3dB (+) (GHz) | 873.1 | 873.5 | 873.6 | 873.2 | 873.2 | 873.2 | 873.4 | 874.0 |
| 30dB BAND WIDTH (GHz) | 80.3 | 67.4 | 25.6 | 63.9 | 74.1 | 61.8 | 66.5 | 17.6 |
| 3dB BAND WIDTH (GHz) | 45.7 | 45.8 | 47.2 | 45.8 | 45.8 | 45.7 | 45.8 | 46.2 |

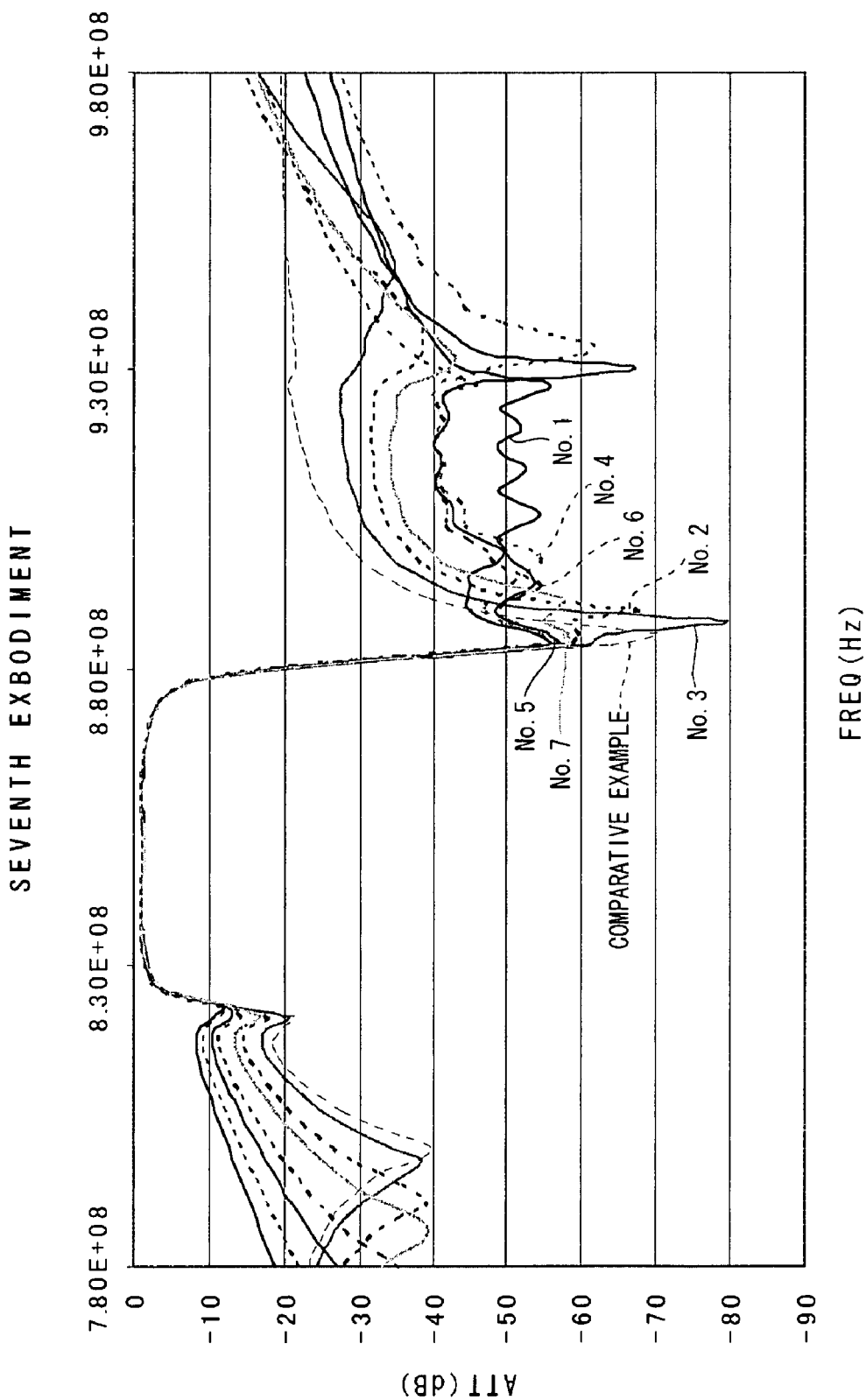

SAW FILTER CIRCUIT

BACKGROUND OF THE INVENTION

1. Field of the Invention

The present invention generally relates to a SAW filter circuit. More specifically, the present invention relates to a SAW filter circuit, and especially to a SAW filter circuit for transmission and reception, which can be used for small mobile communications apparatus such as a cellular phone.

2. Background Information

For example, conventional SAW filter circuits are shown in *The Journal of the Institute of Electronics, Information and Communication Engineers*, February 1993, and Japanese Laid-Open Patent Publications Nos. 10-93382, 2002-208835, and 2003-101384, which are hereby incorporated by reference.

The non-patent reference, *The Journal of the Institute of Electronics, Information and Communication Engineers*, February 1993, Vol. J76-A, No. 2, especially pages 245–251, discloses a SAW filter that is constituted from a ladder type circuit having one serial arm resonator and one parallel arm resonator. The serial arm resonator shows a double resonance characteristic. Specifically, frequency characteristics of Xp and Xs are shown. The frequency characteristic of XP is a deciding factor of the impedance $Zp=jXp$ (j is an imaginary unit) of the parallel arm resonator. Further, the frequency characteristic of Xs, which is a deciding factor of the impedance $Zs=jXs$. This SAW filter circuit is designed so that the anti-resonance frequency fap of Xp and the resonance frequency frs of Xs may be in agreement, and it is constituted so that it may have a pass band in which a center frequency f equals fap which equals frs (i.e. $f=fap=frs$). Moreover, the SAW filter circuit is constituted so that a frequency of an attenuation pole of a low-pass side equals a frequency that makes Xp '0,' and a frequency of an attenuation pole of a high-pass side equals a frequency that makes Xs into a local maximum. Thereby, near the center frequency, Xp is set to be larger than 50 ohms and Xs is set to '0.' By having such a constitution, reduction of insertion loss in the pass band, reservation in the amount of attenuation in an attenuation band, and elimination of an alignment circuit are realized.

Japanese Laid-Open Patent Publication No. 10-93382 discloses a SAW filter circuit that is constituted from a ladder type circuit having a plurality of parallel arm resonators. In this SAW filter circuit, ground sides of the parallel arm resonators are made to have equal potential on a common bonding pad. Further, the bonding pad is electrically connected to the ground of a package by a common bonding wire (inductance LE). Thereby, when the standard amount of attenuation in a low-pass side attenuation band is eased, it is able to realize a redress in the amount of attenuation in a high-pass side attenuation band and improvement of insertion loss in a pass band.

Japanese Laid-Open Patent Publication No. 2002-208835 discloses a SAW filter circuit that is made of a band-pass ladder type SAW filter and a two-terminal pair circuit. The two-terminal pair circuit is composed of three inductors, and the band-pass ladder type SAW filter and the two-terminal pair circuit are serialized. In this SAW filter circuit, by having these three inductors in the two-terminal pair circuit, two attenuation bands can be formed for each of a high-pass side and a low-pass side of the pass band. The amount of attenuation can be improved not only in the attenuation band of the high-pass side but also in the attenuation band of the low-pass side.

Japanese Laid-Open Patent Publication No. 2003-101384 discloses a SAW filter circuit that is constituted from a ladder type circuit having a plurality of serial arm resonators and a plurality of parallel arm resonators. In this SAW filter circuit, a ground side of each parallel arm resonators is electrically connected to a bonding pad through an individual inductor L (bonding wire). The bonding pad is electrically connected to the ground of a package through an inductor Lp (bonding wire), thereby the ground side of each parallel arm resonators is electrically connected to the ground of the package. Moreover, in this SAW filter circuit, the inductance value needed for the bonding wire is reduced by arranging a capacitor between the ground side of the parallel arm resonator located on an input stage and the ground side of the parallel arm resonator located on an output stage.

Generally, in a mobile telecommunications terminal, a transmitting band and a receiving band have to be set to be wide, and the interval between the transmitting band and the receiving band has to be set to be narrow. Therefore, it is necessary to secure a sufficient amount of attenuation in a band to which the transmitting band and the receiving band approach. In other words, when the transmitting band is on a low-pass side and the receiving band is on a high-pass side, it is necessary to constitute each SAW filter so that sufficient attenuation characteristics may be acquired at the edge of the high side or the low side of each pass band, while securing the amount of attenuation by the high band of a transmission filter or the low band of a reception filter.

With the ladder type circuit composition given in the non-patent reference, *The Journal of the Institute of Electronics*, since the transmission filter and the reception filter each has only a single attenuation pole on each of the low side attenuation band and the high side attenuation band, it is realized that it is difficult to acquire the sufficient attenuation band width for each attenuation band.

With the circuit compositions given in the first two Japanese Laid-Open Patent Publications, 10-93382 and 2002-208835, the attenuation band width of the attenuation band satisfying the required amount of attenuation tends to become wider as the inductance value becomes larger. This inductance is made of a bonding wire or a strip line. When this inductance is constituted by the bonding wire, the inductance value becomes larger as the bonding wire becomes longer, and the attenuation characteristics become highly dependent on the length of the bonding wire.

With the circuit composition given in Japanese Laid-Open Patent Publication 2003-101384, by arranging the capacitor between the ground side of the parallel arm resonator located on the input stage and the ground side of the parallel arm resonator located on the output stage, reduction in the inductance value needed for the bonding wire and reduction in the length of the bonding wire are attempted. However, in order to reduce the length of the wire bonding, it is necessary to use a considerably large capacitor to obtain a large capacitance value, and therefore, downsizing of a SAW filter equipment is difficult. In this respect, a SAW filter circuit that is suitable for miniaturization of the SAW filter equipment, and has good attenuation characteristics in the attenuation band is required.

In view of the above, it will be apparent to those skilled in the art from this disclosure that there exists a need for an improved SAW filter circuit. This invention addresses this need in the art as well as other needs, which will become apparent to those skilled in the art from this disclosure.

SUMMARY OF THE INVENTION

An object of the present invention is to resolve the above-described problems, and to provide a SAW filter circuit that is suitable for miniaturization and has good attenuation characteristics in the attenuation band.

A SAW filter circuit in accordance with a first aspect of the present invention having a first circuit and a second circuit is provided.

The first circuit is made of first to fourth connecting points, a first SAW resonator, a second SAW resonator, and a third SAW resonator. The first SAW resonator electrically connects the first and second connecting points. The second SAW resonator electrically connects the first and third connecting points. The third SAW resonator electrically connects the second and fourth connecting points.

The second circuit is made of a fifth to eighth connecting points and first to third passive elements. The fifth connecting point electrically connects the third connecting point. The sixth connecting point electrically connects the fourth connecting point. The seventh and eighth connecting points are electrically short-circuited. The first passive element electrically connects the fifth and sixth connecting points. The second passive element electrically connects the fifth and seventh connecting points. The third passive element electrically connects the sixth and eighth connecting points. Each of the first to third passive elements is an inductor or a capacitor, and at least one of the first to third passive elements is a capacitor.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 5 is a view of a table showing a cross length and logarithm of a SAW resonator used in a simulation with respect to the first to fourth embodiments of the present invention;

FIG. 6 is a view of a table showing simulation results using the SAW filter according to the first embodiment of the present invention;

FIG. 11 is a view of a table showing simulation results using the SAW filter according to the second embodiment of the present invention;

FIG. 15 is a view of a table showing simulation results using the SAW filter according to the third embodiment of the present invention;

FIG. 19 is a view of a table showing simulation results using the SAW filter according to the fourth embodiment of the present invention;

FIG. 24 is a view of a table showing a cross length and logarithm of a SAW resonator of a SAW filter used in a simulation with respect to the fifth to seventh embodiments of the present invention;

FIG. 25 is a view of a table showing simulation results using the SAW filter according to the fifth embodiment of the present invention;

FIG. 29 is a view of a table of simulation results using the SAW filter according to the sixth embodiment of the present invention;

FIG. 33 is a view of a table showing simulation results using the SAW filter according to the seventh embodiment of the present invention; and FIG. 34 is view of a graph of simulation results using the SAW filter according to the seventh embodiment of the present invention.

DETAILED DESCRIPTION OF THE PREFERRED EMBODIMENTS

Figure 1:
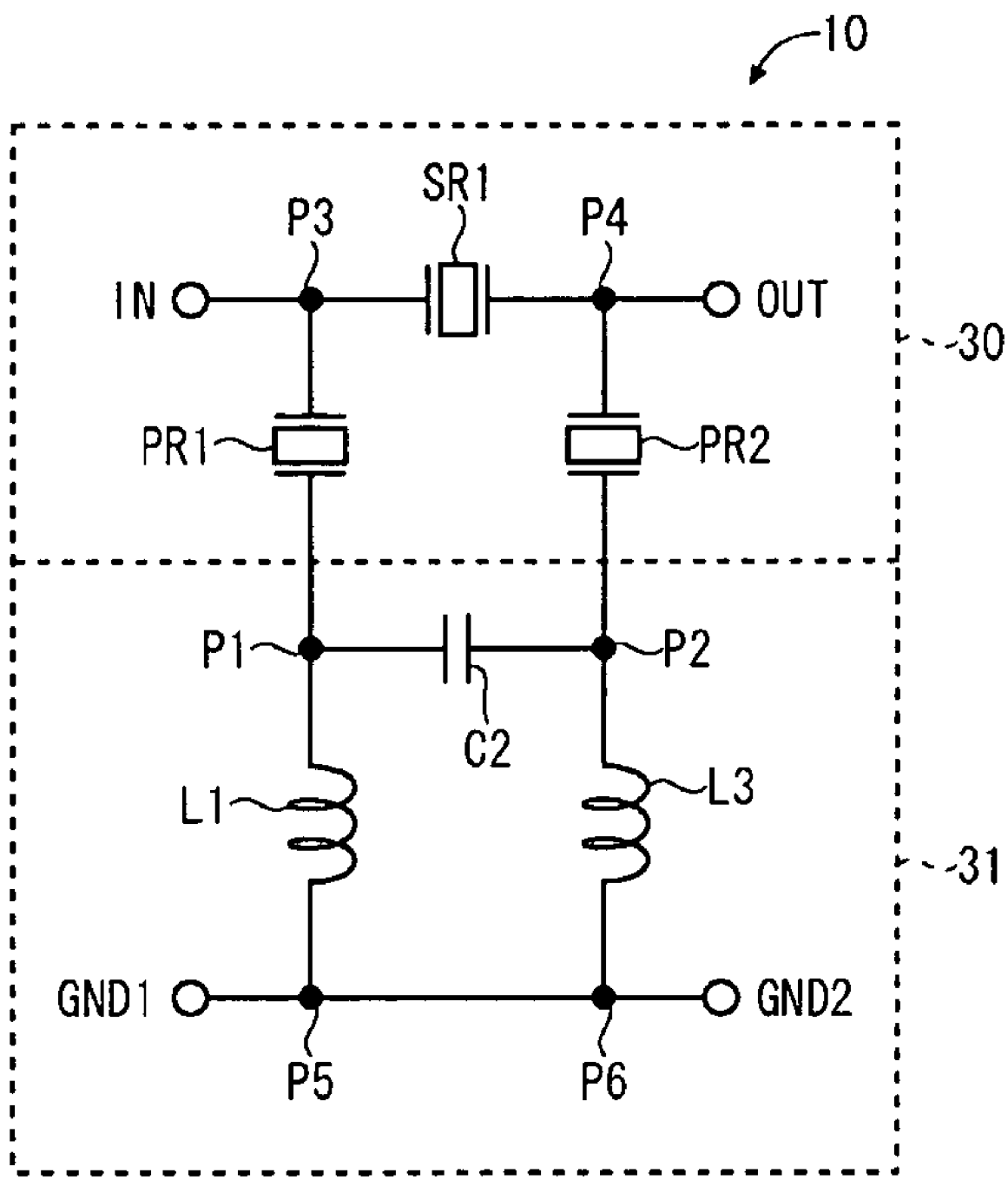
FIG. 1 is a view of a circuit diagram of a SAW filter circuit according to a first preferred embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

Structure

FIG. 1 is a view of a circuit diagram of a SAW filter circuit 10 according to a first preferred embodiment of the present invention.

The SAW filter circuit 10 includes a two-terminal pair circuit 30 and a two-terminal pair circuit 31 that is connected to the two-terminal pair circuit 30 in series. The two-terminal pair circuit 30 is provided with a SAW resonator SR1, a SAW resonator PR1, a SAW resonator PR2, an input terminal IN, an output terminal OUT, and connecting points P3 and P4. The two-terminal pair circuit 31 is provided with a capacitor C2, an inductor L1, an inductor L3, grounds GND1 and GND2, and connecting points P1, P2, P5, and P6. Hereafter, the SAW resonators will be referred to simply as resonators for brevity.

In the SAW filter circuit 10, the resonator PR1 of the two-terminal pair circuit 30 is connected to the capacitor C2 and the inductor L1 of the two-terminal pair circuit 31 through the connecting point P1. Moreover, the resonator PR2 of the two-terminal pair circuit 30 is connected to the capacitor C2 and the inductor L3 of the two-terminal pair circuit 31 through the connecting point P2. Thereby, the two-terminal pair circuit 30 and the two-terminal pair circuit 31 are connected in series.

The resonator SR1 is a serial arm resonator disposed in the serial arm that has the connecting points P3 and P4. Further, the resonator SR1 is electrically connected to the input terminal IN through the connecting point P3 while being electrically connected to the output terminal OUT through the connecting point P4. The resonator PR1 is a parallel arm resonator disposed in the parallel arm that has the connecting points P3, P1, and P5. Further, the resonator PR1 is electrically connected to the input terminal IN through the connecting point P3 while being electrically connected to the capacitor C2 and the inductor L1 through the connecting point P1. The resonator PR2 is a parallel arm resonator disposed in the parallel arm that has the connecting points P4, P2, and P6. Further, the resonator PR2 is electrically connected to the output terminal OUT through the connecting point P4 while being electrically connected to the capacitor C2 and the inductor L3 through the connecting point P2.

The capacitor C2 electrically connects the connecting point P1 and the connecting point P2. Therefore, the capacitor C2 is electrically connected to the inductor L1 and the resonator PR1 through the connecting point P1, and is electrically connected to the inductor L3 and the resonator PR2 through the connecting point P2. The inductor L1 electrically connects the connecting point P1 and connecting point P5. Therefore, the inductor L1 is electrically connected to the capacitor C2 and the resonator PR1 through the connecting point P1, and is electrically connected to the ground GND1 through the connecting point P5. The inductor L3 is electrically connected to the connecting point P2 and the connecting point P6. Therefore, the inductor L3 is electrically connected to the capacitor C2 and the resonator PR2 through the connecting point P2, and electrically connects to the ground GND2 through the connecting point P6. The grounds GND1 and GND2 are electrically short-circuited through the connecting points P5 and P6.

Figure 2:
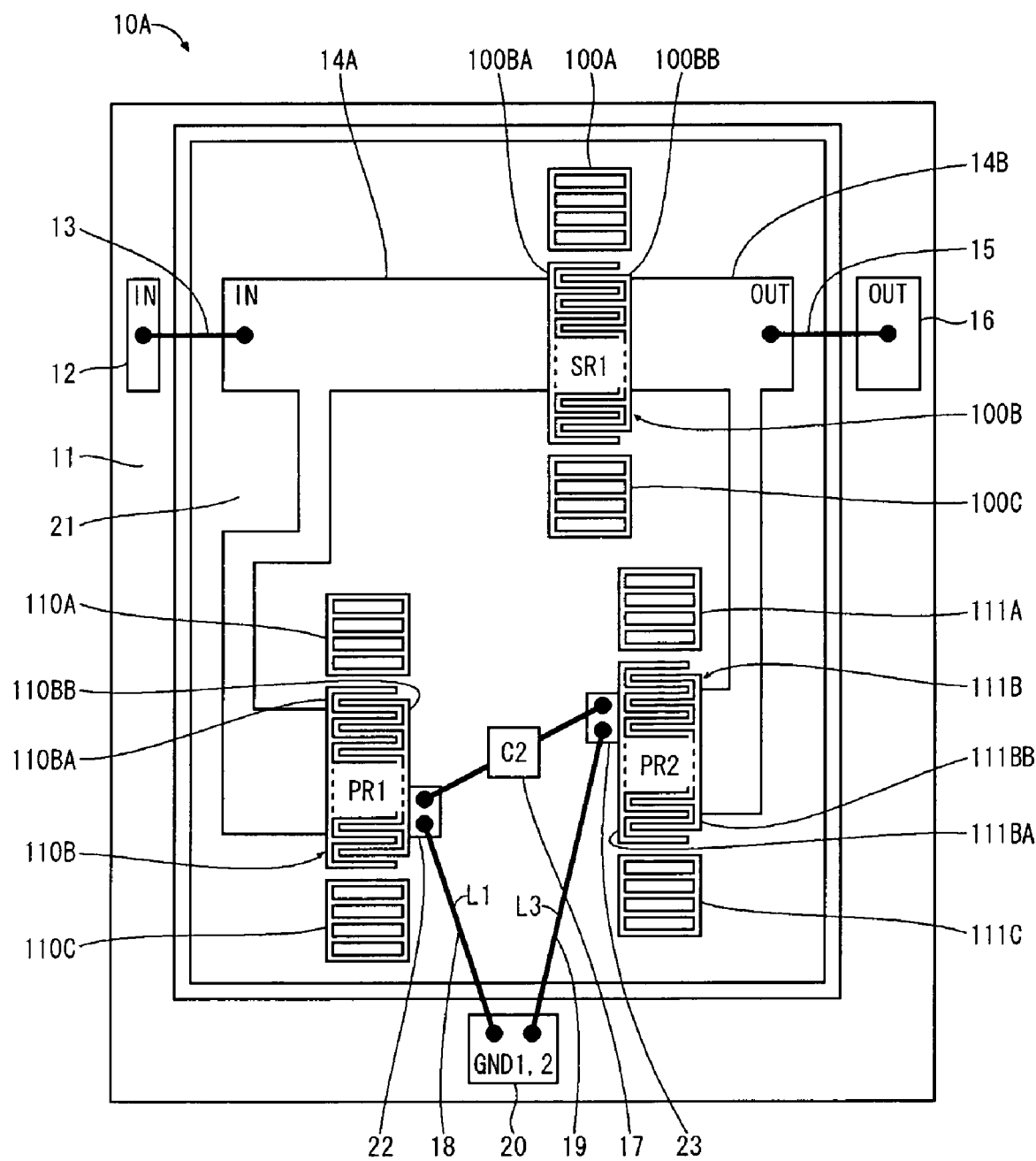
FIG. 2 is a view of a diagram showing an example of a mounted SAW filter circuit according to the first embodiment of the present invention.

FIG. 2 is a view of a diagram showing an example of a mounted SAW filter circuit 10 according to the first embodiment. More specifically, FIG. 2 shows a SAW filter device 10A that is constructed using the same micro fabrication technology as used for a semiconductor integrated circuit.

The SAW filter device 10A includes a piezoelectric substrate 21, patterns formed on a package 11 and the piezoelectric substrate 21, and bonding wires 13, 15, 18, and 19. Resonators SR1, PR1, and PR2, wiring patterns 14A and 14B, and pads 22 and 23 are formed as a pattern on the piezoelectric substrate 21. The Pads 12, 16, and 20 are formed as patterns on the package 11.

The resonator SR1 is equipped with an inter-digital transducer (to be referred to as an IDT in the following description) 100B and grating reflectors 100A and 100C. The inter-digital transducer 100B is made of pectinate electrodes 100BA and 100BB. Further, the grating reflectors 100A and 100C are arranged on opposite sides of the IDT 100B. The resonator PR1 is equipped with an IDT 110B, which is made of pectinate electrodes 110BA and 110BB, and grating reflectors 110A and 110C arranged at both sides of the IDT 110B. The resonator PR2 is equipped with an IDT 111B, which is made of pectinate electrodes 111BA and 111BB, and grating reflectors 111A and 111C arranged on opposite sides of the IDT 111B.

The wiring patterns 14A and 14B, and pads 22 and 23 are, for example, preferably made of tungsten (W). In the resonator SR1, the pectinate electrode 100BA is connected to the wiring pattern 14A and the pectinate electrode 100BB is connected to the wiring pattern 14B. In the resonator PR1, the pectinate electrode 110BA is connected to the wiring pattern 14A and the pectinate electrode 110BB is connected to the pad 22. In the resonator PR2, the pectinate electrode 111BA is connected to the pad 23, and the pectinate electrode 111BB is connected to the wiring pattern 14B.

Figure 3:
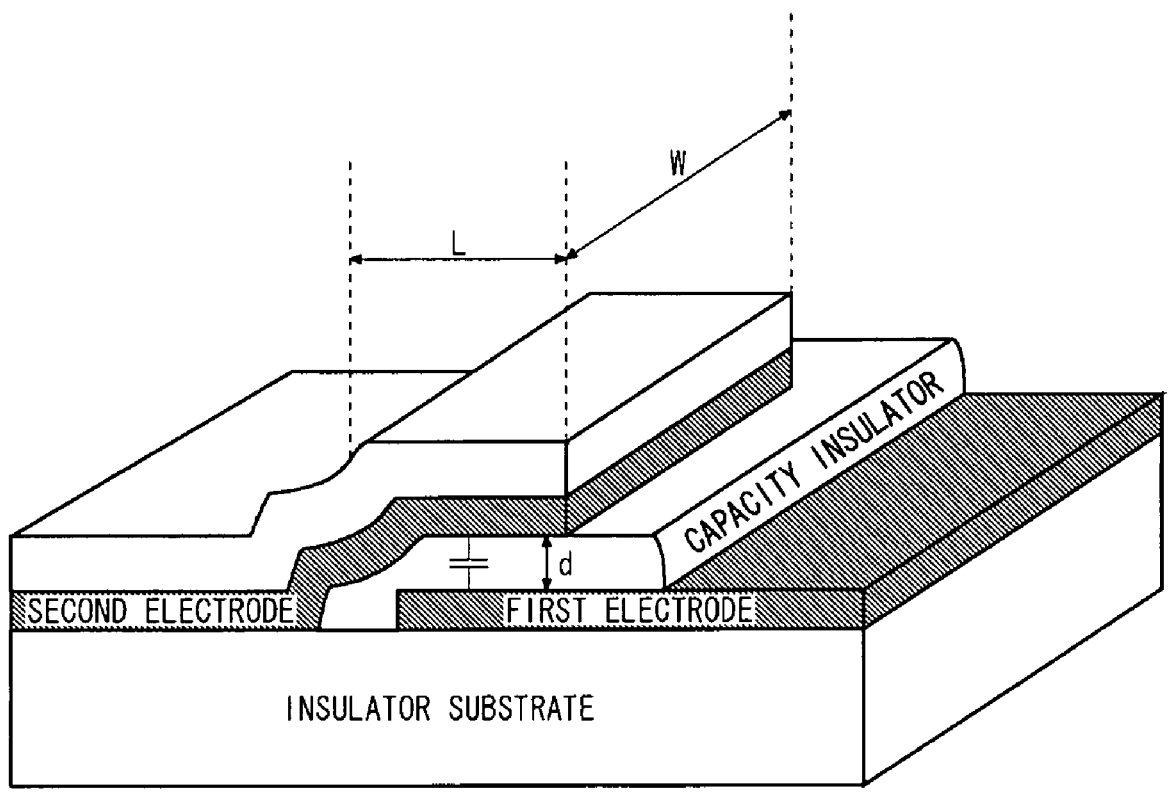
FIG. 3 is a perspective view of an MIM capacitor illustrating the composition thereof with respect to a SAW filter of the first to seventh embodiments of the present invention.

As shown in FIGS. 1 to 3, a pattern 17 is preferable an MIM (metal-insulator-metal) capacitor, and constitutes the capacitor C2. The capacitor C2 is electrically connected to the pads 22 and 23 by bonding wires. This MIM capacitor 17 has a structure in which a capacity insulator is wedged between a first electrode and a second electrode from the top and bottom. Further, such an MIM capacitor structure can be formed upon an insulator substrate, as shown in FIG. 3. Therefore, the MIM capacitor 17 is suitable for the micro fabrication process. The capacity C of the MIM capacitor 17 is set by $C = \epsilon_r * \epsilon_0 * (W*L)/d$, provided that a specific inductive capacity of the capacity insulator is '$\epsilon_r$,' an electric constant is '$\epsilon_0$,' the distance between the first and the second electrodes is 'd,' and the area that the first and the second electrodes are facing is 'W*L'. The capacitor C2 may be constituted using a known chip capacitor that is a discrete chip part. In this case, the chip capacitor should be arranged either inside the package or outside the package, and be electrically connected to the pads 22 and 23 by the bonding wires. Moreover, the capacitor C2 may be made by using the piezoelectric substrate 21 as the capacity insulator, and respectively forming electrode patterns in the upper and lower sides of the piezoelectric substrate 21. In this case, those two electrode patterns are electrically and respectively connected to the pads 22 and 23 by the bonding wires.

The bonding wire 18 is connected to the pads 22 and 20, and constitutes the inductor L1 of FIG. 1. As shown in FIG. 2, the bonding wire 19 is connected to the pads 23 and 20, and constitutes the inductor L3 of FIG. 1. The pad 20 corresponds to the grounds GND1 and GND2 of FIG. 1.

Still referring to FIGS. 1 and 2, the pad 12 corresponds to the input terminal IN of FIG. 1, and is connected to the wiring pattern 14A by the bonding wire 13. The pad 16 corresponds to the output terminal OUT of FIG. 1, and is connected to the wiring pattern 14B by the bonding wire 15.

With respect to the present invention, the bonding wires used as the inductors are constituted so that they may have desired inductance values, and other bonding wires are constituted so that they may have sufficiently small inductance values. For example, in this embodiment, the bonding wires 18 and 19 used as the inductors L2 and L3 are constituted so that they may have desired inductance values. Further, the bonding wires 13 and 15 and the bonding wires that connect the capacitor C2 to the pads 22 and 23 are constituted so that they may have sufficiently small inductance values.

The bonding wires that connect the pattern 17 to the pads 22 and 23 have sufficiently small inductance values, but the inductance values are not zero. Thereby, the impedance of the capacitor C2 is decided by the capacity components of the pattern 17 and the inductance values of the bonding wires that are used to connect electrically the pattern 17 to the pads 22 and 23. Therefore, the capacitance value of the pattern 17 is decided by taking the inductance value of the bonding wires into consideration.

Simulation (Simulation Principle)

1. SAW Filter of the First Embodiment

The principle for simulating the attenuation characteristics of the SAW filter circuit 10 according to the first embodiment will be described.

First, Z matrix Z(23) of the SAW filter circuit 10 is obtained, and Z(32) is translated into F matrix F(32), and then an operation transfer coefficient S(32) is calculated from F matrix F(32). Then the attenuation characteristics of the SAW filter circuit 10 are calculated by calculating attenuation characteristics $\alpha(\omega)$ from the operation transfer coefficient S(32), and changing frequency in $\alpha(\omega)$. In the following, formulae are explained concretely.

Z matrix Z(32) of the SAW filter circuit 10 is given by Formula (1). In the following formulae, Z(30) is a Z matrix of the two-terminal pair circuit 30, and Z(31) is a Z matrix of the two-terminal pair circuit 31.

$$Z(32)=Z(30)+Z(31) \quad (1)$$

Z(30) is calculated as shown in Formula (2). In Formula (2), $Z_{ij}$ expresses an i row j column component of the Z matrix. Z(PR1) is the impedance of the resonator PR1, Z(SR1) is the impedance of the resonator SR1, and Z(PR2) is the impedance of the resonator PR2. Moreover, K1 is given by Formula (3).

$$Z(30) = \begin{bmatrix} Z_{11} & Z_{12} \\ Z_{21} & Z_{22} \end{bmatrix} \quad (2)$$

$$Z_{11} = Z_{11}(30)$$

$$Z_{12} = Z_{12}(30)$$

$$Z_{21} = Z_{21}(30)$$

$$Z_{22} = Z_{22}(30)$$

$$Z_{11}(30) = \frac{Z(PR1) \times (Z(SR1) + Z(PR2))}{K1}$$

$$Z_{12}(30) = \frac{Z(PR1) \times Z(PR2)}{K1}$$

$$Z_{21}(30) = \frac{Z(PR1) \times Z(PR2)}{K1}$$

$$Z_{22}(30) = Z(PR2) \times (Z(PR1) + Z(SR1))$$

$$K1=Z(PR1)+Z(SR1)+Z(PR2) \quad (3)$$

Z(31) is given by Formula (4). K2 in Formula (4) is given by Formula (5), and Z1 to Z3 in Formula (4) are given by Formula (6).

$$Z(31) = \begin{bmatrix} Z_{11} & Z_{12} \\ Z_{21} & Z_{22} \end{bmatrix} \quad (4)$$

$$Z_{11} = Z_{11}(31)$$

$$Z_{12} = Z_{12}(31)$$

$$Z_{21} = Z_{21}(31)$$

$$Z_{22} = Z_{22}(31)$$

$$Z_{11}(31) = \frac{Z1 \times (Z2 + Z3)}{K2}$$

$$Z_{12}(31) = \frac{Z1 \times Z3}{K2}$$

$$Z_{21}(31) = \frac{Z1 \times Z3}{K2}$$

$$Z_{22}(31) = Z3 \times (Z1 + Z2)$$

$$K2=Z1+Z2+Z3 \quad (5)$$

$$Z1 = j\omega L1 \quad (6)$$

$$Z2 = -\frac{j}{\omega C2}$$

$$Z3 = j\omega L3$$

Specifically, $K2=(1/S)(S^2+\omega 23^2)$, $\omega 23^2=1/\{(L1+L3)*C2\}$, and each element of Z(31) may be expressed by Formula (7). In the following formulae, $S=j\omega$, $\omega 10^2=1/(L3*C2)$, and $\omega 20^2=1/(L1*C2)$.

$$Z_{11}(31) = \frac{S \times (L1 \times L3) \times (S^2 + \omega 10^2)}{(L1+L3) \times (S^2 + \omega 23^2)} \quad (7)$$

$$Z_{12}(31) = Z_{21}(31) = S^3 + \frac{L1 \times L3}{S^2 + \omega 23^2}$$

-continued $$Z_{22}(31) = \frac{S \times (L1 \times L3) \times (S^2 + \omega 20^2)}{(L1 + L3) \times (S^2 + \omega 23^2)}$$

When Z(32) is translated into F matrix F(32), it is calculated as shown in Formula (8).

$$F(32) = \begin{bmatrix} A & B \\ C & D \end{bmatrix} \quad (8)$$

$$A = A(32)$$

$$B = B(32)$$

$$C = C(32)$$

$$D = D(32)$$

$$A(32) = \frac{Z_{11}(32)}{Z_{21}(32)}$$

$$B(32) = \frac{Z_{11}(32) \times Z_{22}(32) - Z_{12}(32) \times Z_{21}(32)}{Z_{21}(32)}$$

$$C(32) = \frac{1}{Z_{21}(32)}$$

$$D(32) = \frac{Z_{22}(32)}{Z_{21}(32)}$$

The operation transfer coefficient S(32) may be obtained by Formula (9) using F matrix F(32).

$$Z(32) = \frac{A(32) + B(32) + C(32) + D(32)}{2} \quad (9)$$

Therefore, the attenuation characteristics $\alpha(\omega)$ may be obtained by Formula (10) using the operation transfer coefficient S(32).

$$\alpha(\omega) = 20 \log[ABS(S(32))] \quad (10)$$

2. SAW Filter of Comparative Example

Figure 4:
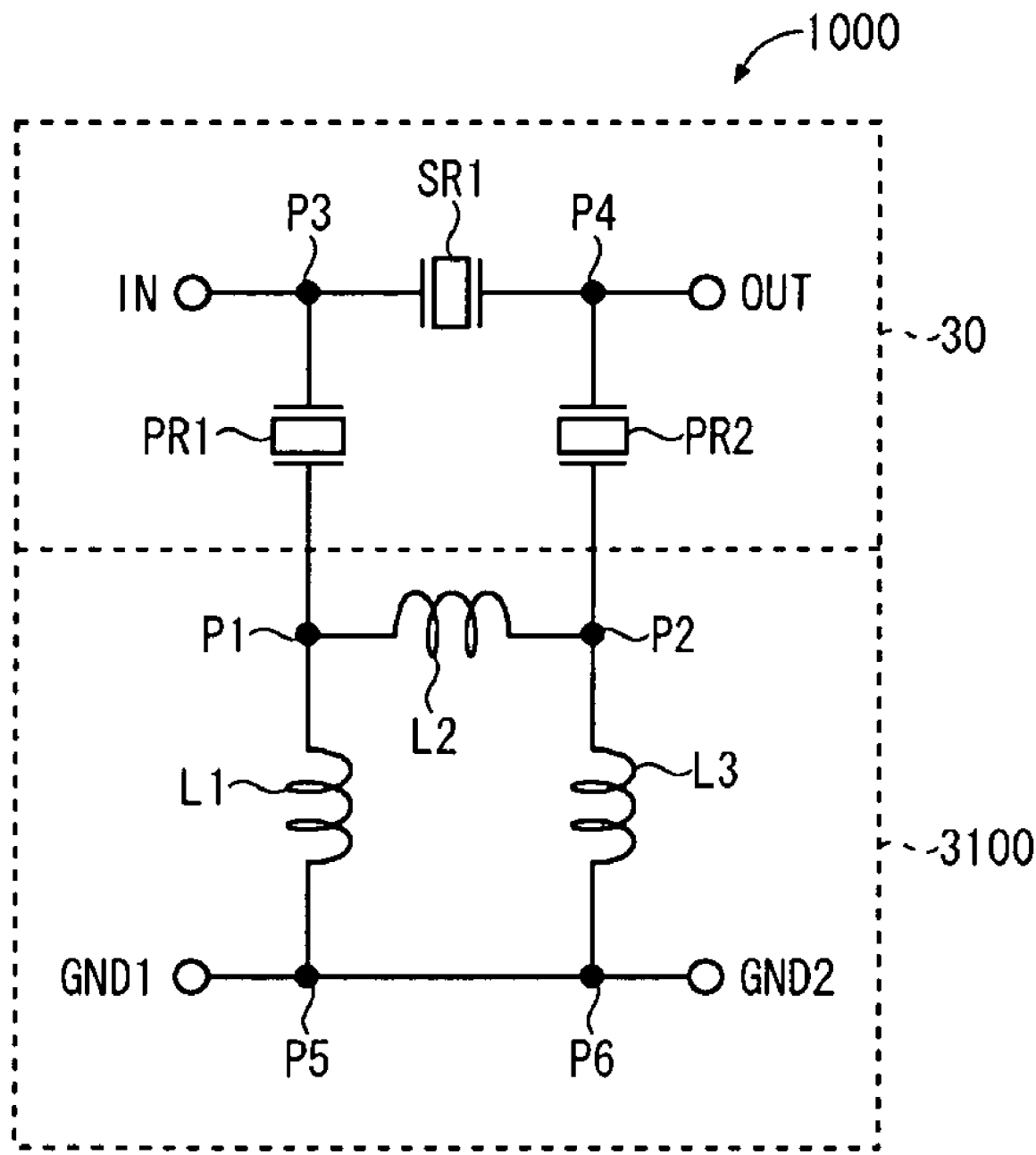
FIG. 4 is a view of a circuit diagram of a SAW filter circuit according to a comparative example.

Referring now to FIG. 4, a SAW filter circuit 1000 of a comparative example has a circuit composition as shown. The SAW filter circuit 1000 has a structure similar to that of the circuit shown in FIG. 1, but in the SAW filter circuit 1000, the capacitor C2 used in the circuit of FIG. 1 is replaced by an inductor L2 in a two-terminal pair circuit 3100. In other words, a case in which all the elements that constitute the two-terminal pair circuit 3100 are inductors is assumed. The attenuation characteristics of the SAW filter circuit 1000 may also be calculated through Formulae (1) to (10). However, with respect to Formula (6), Z2 is considered to be jωL2 (i.e. Z2=jωL2), and Formula (7) is transposed to the following Formula (7-a).

$$Z_{11}(31) = \frac{S \times L1 \times (L2 + L3)}{L1 + L2 + L3} \quad (7\text{-a})$$

$$Z_{12}(31) = Z_{21}(31) = \frac{S \times L1 \times L3}{L + L2 + L3}$$

$$Z_{22}(31) = \frac{S \times L3 \times (L1 + L2)}{L1 + L2 + L3}$$

(Simulation Result)

Cross lengths and number of pairs of the pectinate electrodes of the resonators SR1, PR1, and PR2 used for the simulation are shown in FIG. 5. As shown in FIG. 5, with respect to the resonator SR1, a cross length was set to 70 micrometers and the number of pairs of the pectinate electrodes was set to 70. Further, with respect to the resonators PR1 and PR2, a cross length was set to 60 micrometers and the number of pairs of the pectinate electrodes was set to 80, respectively. Moreover, the simulation was performed for each cases in which the capacitance value of the capacitor C2 and the inductance value of the inductors L1 and L3 were set to the values in columns No. 1 to No. 4 shown in FIG. 6, and about the comparative example. In the SAW filter circuit 1000 of the comparative example, L1, L2, and L3 are 0.2 nH (i.e. L1=L2=L3=0.2 nH).

Figure 7:
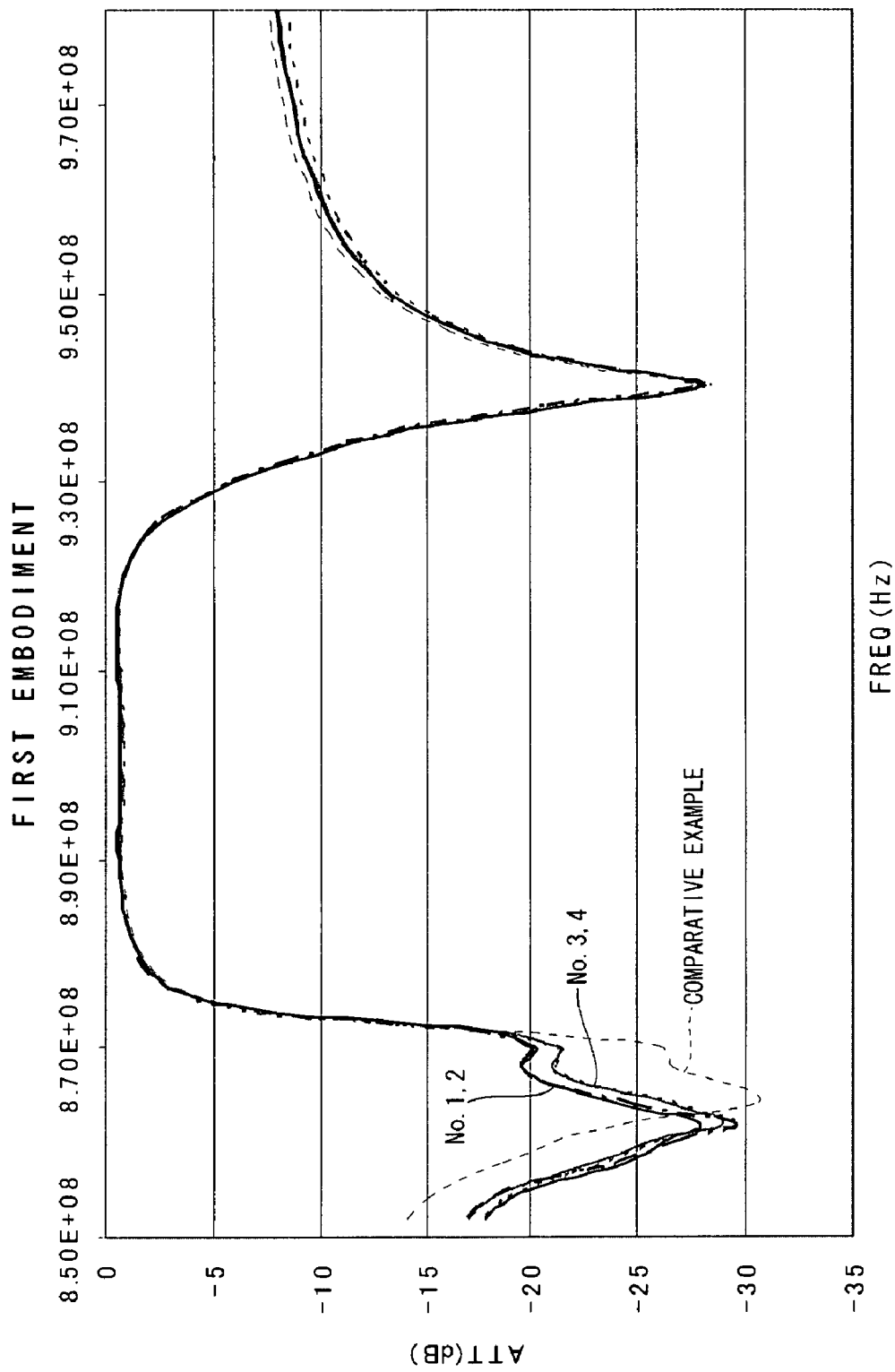
FIG. 7 is a view of a graph of simulation results using the SAW filter according to the first embodiment of the present invention.

FIG. 6 also numerically expresses the simulation results. FIG. 7 expresses the attenuation characteristics of the simulation results in a graph.

In FIG. 6, 20 dB (−) is a frequency value of a lower frequency in the band in which the value of attenuation is less than −20 dB in a low-pass side attenuation band. Further, 20 dB (+) is a frequency value of a higher frequency in the band in which the value of attenuation is less than −20 dB in the low-pass side attenuation band. A 20 dB band width is a difference between the frequency of 20 dB (+) and the frequency of 20 dB (−). Further, it is the band width of the band in which the value of attenuation that is less than −20 dB may be secured in the low-pass side attenuation band. 3 dB (−) is a frequency value of a lower frequency in the band in which the value of attenuation is more than −3 dB, and 3 dB (+) is a frequency value of a higher frequency in the band in which the value of attenuation is more than −3 dB. The 3 dB band width is a difference between the frequency of 3 dB (+) and the frequency of 3 dB (−), and shows a band width of a pass band.

Referring to FIGS. 6 and 7, it is shown that the 20 dB band widths in the low-pass side attenuation band of the SAW filter circuit 10 (with respect to columns No. 1 to No. 4) become wider than that of the SAW filter circuit 1000 of the comparative example. In other words, according to the SAW filter circuit 10 of the first embodiment, the attenuation characteristics in the low-pass side attenuation band are better than those of the comparative example. Moreover, referring to FIGS. 6 and 7, it is shown that the 3 dB band widths of the SAW filter circuit 10 (with respect to columns No. 1 to No. 4) are almost the same as that of the comparative example, which means that the pass bands of the first embodiment and the comparative example are almost the same. Furthermore, the SAW filter circuit 10 of the first embodiment shows almost the same attenuation characteristics in a high-pass side attenuation band as in the case of the SAW filter circuit 1000 of the comparative example. From the above explanation, it is obvious from this disclosure that the SAW filter circuit 10 of the first embodiment is capable of improving the attenuation characteristics in the low-pass side while maintaining the attenuation characteristics in the pass band and the high-pass side.

Operational Effects

According to the first embodiment of the present invention, in the case in which the SAW filter circuit 10 is constructed by having the two-terminal pair circuit 30 composed of the resonators SR1, PR1, and PR2 serialized to the two-terminal pair circuit 31 composed of passive elements (each passive element is an inductor or a capacitor), one of the passive elements is formed as the capacitor C2. With this structure, the SAW filter 10 of the first embodiment of the present invention is capable of reducing the number of inductors in contrast to a case in which all the passive elements of the two-terminal pair circuit 3100 of a SAW filter circuit are formed as inductors. By the reduction in the number of inductors in which each of the inductance values is dependent on the length of the bonding wire, the SAW filter circuit 10 may be downsized.

Furthermore, when one of the passive elements of the two-terminal pair circuit 31 is formed as the capacitor C2, the 20 dB band width in the low-pass side attenuation band shown in FIGS. 6 and 7 may be expanded, when compared to the case in which all the passive elements of the two-terminal pair circuit 31 of a SAW filter circuit are formed as inductors. In other words, according to the SAW filter circuit 10 of the first embodiment of the present invention, the low-pass side attenuation characteristics may be improved.

Figure 8:
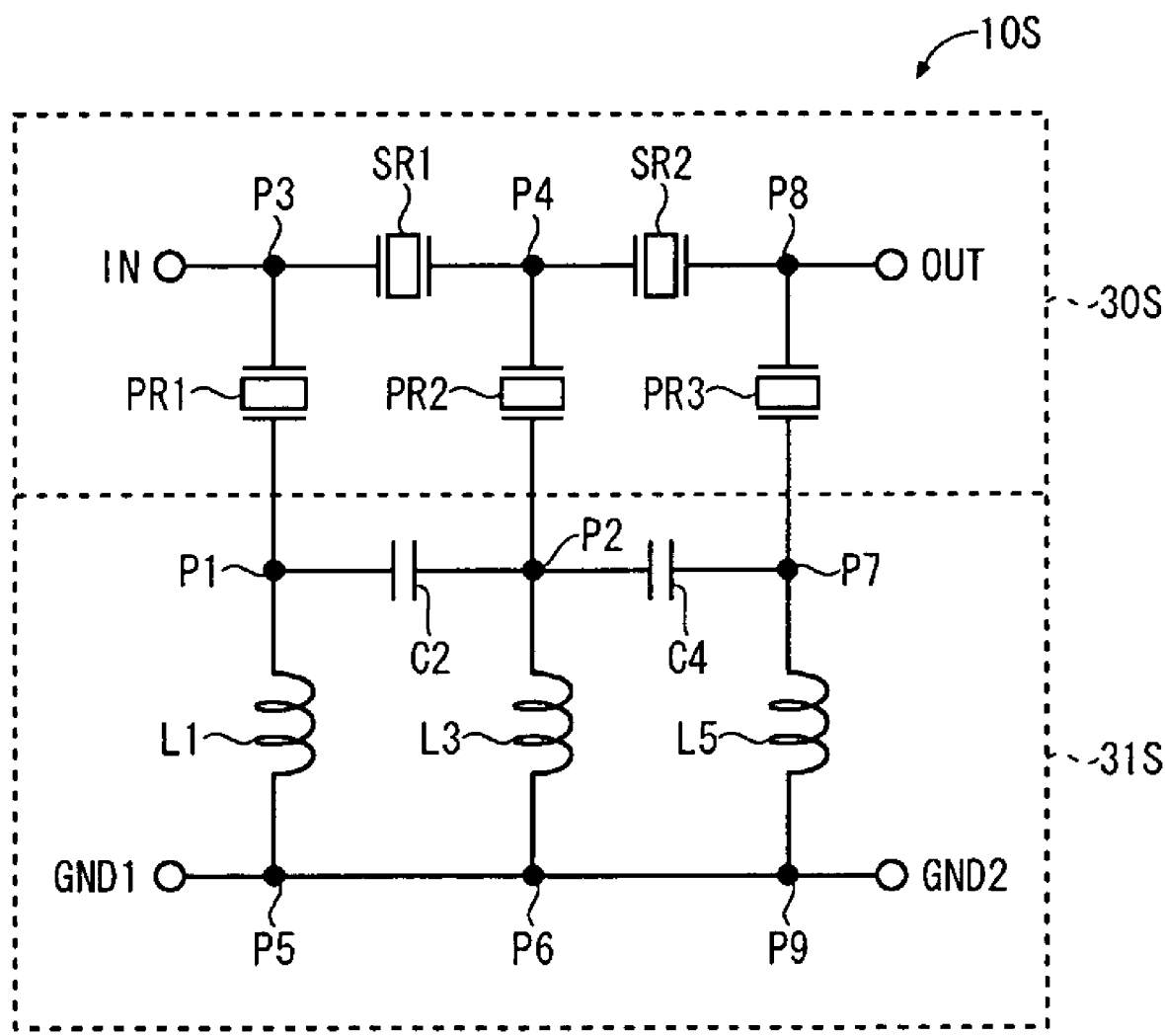
FIG. 8 a view of a circuit diagram of a SAW filter circuit constituted by serializing two SAW filter circuits shown in FIG. 1.

Moreover, the SAW filter circuit 10 shown in FIG. 1 may be serialized in the manner shown in FIG. 8. In this case, as compared to the circuit of Japanese Laid-Open Patent Application No. 2003-101384 in which the capacitor is disposed only between the ground side of the parallel arm resonator located on the input stage and the ground side of the parallel arm resonator located on the output stage, the capacitance value required per capacitors may be reduced because at least one capacitor is assigned per three resonators (SR1, PR1, and PR2).

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Alternate Embodiments

Alternate embodiments will now be explained. In view of the similarity between the first and alternate embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

Second Embodiment

Structure

Figure 9:
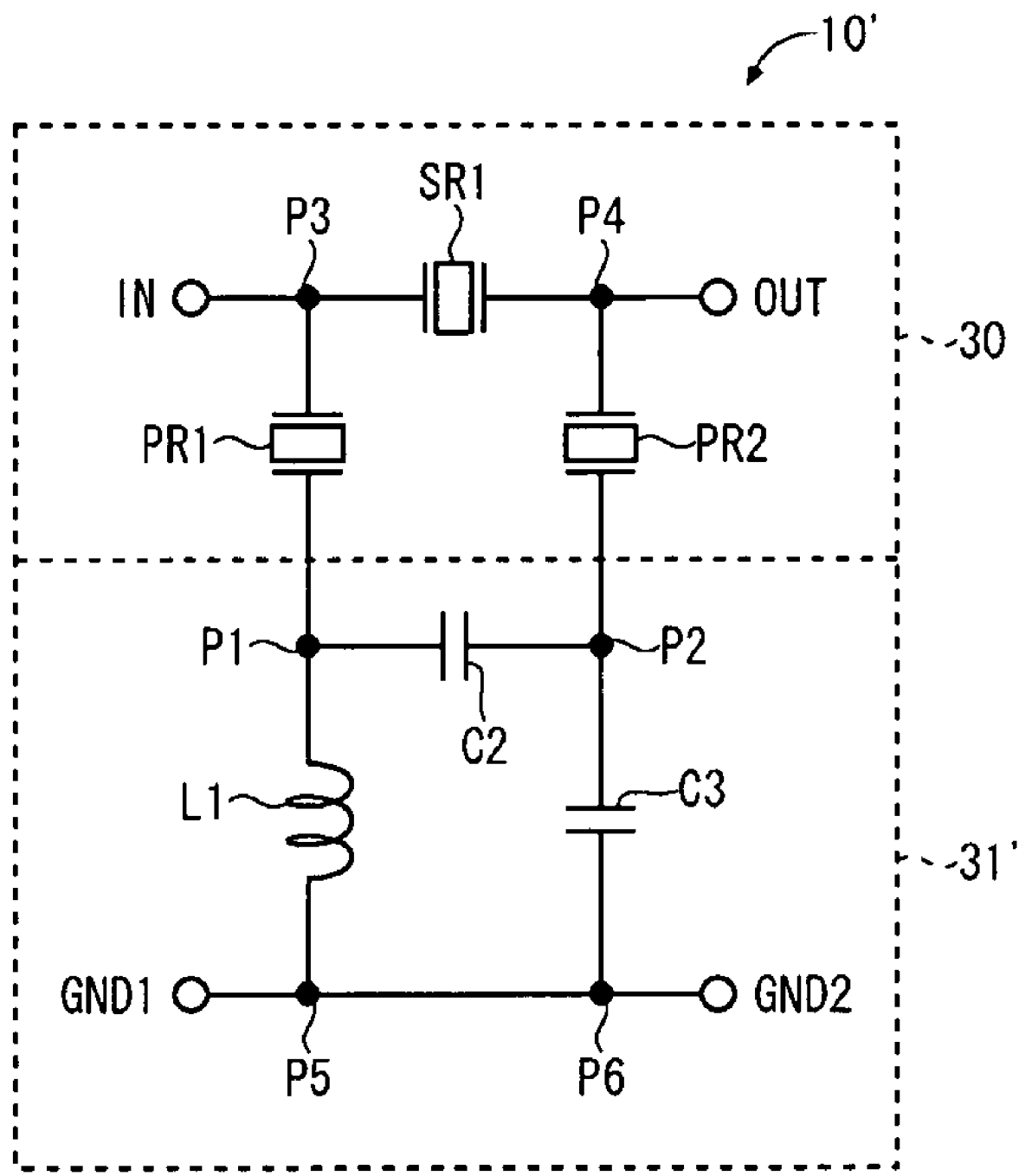
FIG. 9 is a view of a circuit diagram of a SAW filter circuit according to the second preferred embodiment of the present invention.

FIG. 9 is a view of a circuit diagram of a SAW filter circuit 10' according to a second preferred embodiment of the present invention. The SAW filter circuit 10' according to the second embodiment has a structure similar to that of the SAW filter circuit 10 of the first embodiment shown in FIG. 1. However, in the SAW filter circuit 10' according to the second embodiment, the major difference is that the inductor L3 used in the first embodiment shown in FIG. 1 is replaced with a capacitor C3 in a two-terminal pair circuit 31' as shown in FIG. 9.

Figure 10:
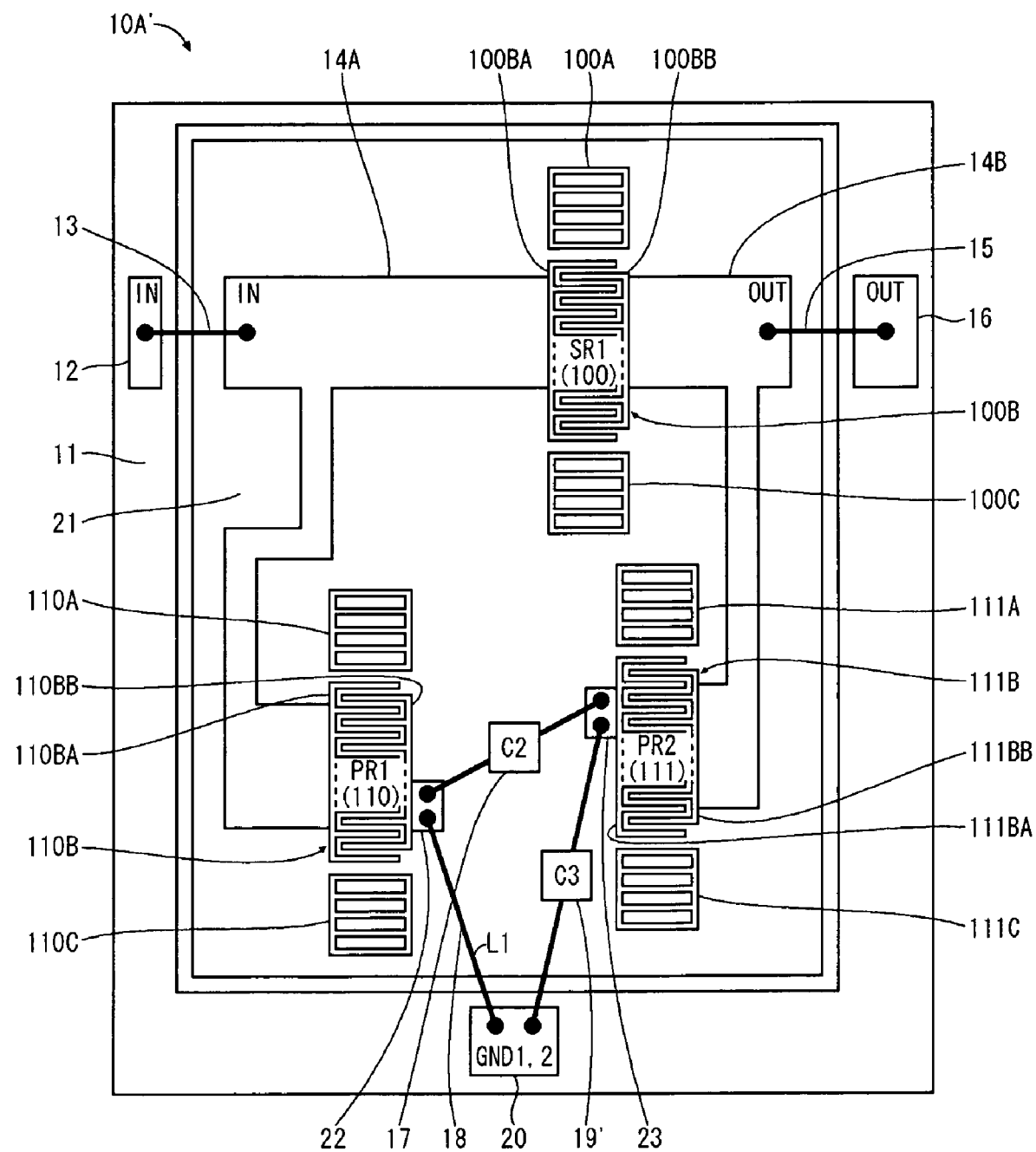
FIG. 10 is a view of a diagram showing an example of a mounted SAW filter circuit according to the second embodiment of the present invention.

FIG. 10 shows an example of a SAW filter device 10A' on which the SAW filter circuit 10' according to the second embodiment is mounted. The SAW filter device 10A' according to the second embodiment has a structure that is similar to that of the SAW filter device 10A of the first embodiment shown in FIG. 2. However, in the SAW filter device 10A' according to the second embodiment, the major difference is that the bonding wire 19 used in the first embodiment shown in FIG. 2 is replaced with a pattern 19 to constitute the capacitor C3 and bonding wires to connect electrically the pattern 19 to the pads 20 and 23. The capacitor C3 constituted by the pattern 19 has the same or similar composition as that of the capacitor C2.

Simulation

The attenuation characteristics $\alpha(\omega)$ of the SAW filter circuit 10' of the second embodiment may also be calculated through Formulae (1) to (10). However, in the second embodiment, the inductor L3 according to the first embodiment is replaced by the capacitor C3. Thus, with respect to Formula (6), Z3 is considered to be $-j/(\omega C3)$ (i.e. $Z3=-j/(\omega C3)$). For this reason, with respect to Formula (5), K2 is considered to be $-j(L1/\omega)(S^2+\omega 23^2)$ (i.e. $K2=-j(L1/\omega)(S^2+\omega 23^2)$), $\omega 23^2$ is considered to be $(C2+C3)/(L1*C2*C3)$ (i.e. $\omega 23^2=(C2+C3)/(L1*C2*C3)$), and Formula (7) is transposed to the following Formula (7-b).

$$Z_{11}(31) = \frac{S \times (C2 + C3)}{C2 \times C3 \times (S^2 + \omega 23^2)} \quad (7\text{-b})$$

$$Z_{12}(31) = Z_{21}(31) = \frac{S}{C3 \times (S^2 \times \omega 23^2)}$$

$$Z_{22}(31) = \frac{S^2 \times \omega 12^2}{S^2 \times C3(S^2 + \omega 23^2)}$$

Figure 12:
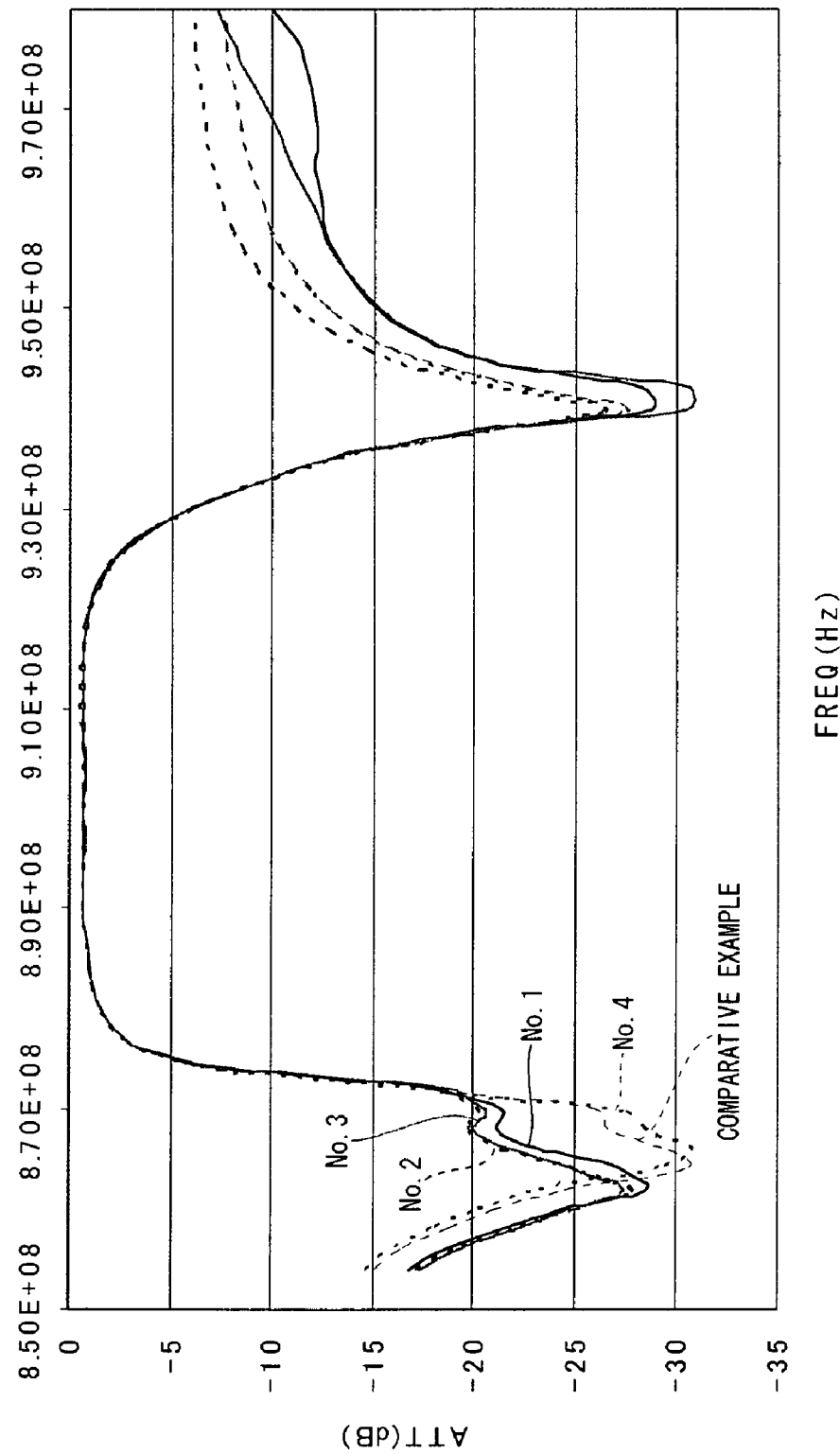
FIG. 12 is a view of a graph of a simulation result using the SAW filter according to the second embodiment of the present invention.

The results obtained from the simulation of the attenuation characteristics $\alpha(\omega)$ of the SAW filter circuit 10' according to the second embodiment are shown in FIGS. 11 and 12. FIG. 11 numerically expresses the simulation results. FIG. 12 expresses the attenuation characteristics of the simulation results in a graph.

With respect to the simulation according to the second embodiment, the cross lengths and the number of pairs of the pectinate electrodes of the resonators SR1, PR1, and PR2 shown in FIG. 5 are used as in the case of the first embodiment. Moreover, the simulation was performed for each of the cases in which the inductance value of the inductor L1 and the capacitance values of the capacitors C2 and C3 were set as the values in columns No. 1 to No. 4 shown in FIG. 11. FIG. 11 also expresses the simulation result of the SAW filter circuit 1000 of the comparative example shown in FIG. 6.

Referring to FIGS. 11 and 12, it is shown that the 20 dB band widths in the low-pass side attenuation band of the SAW filter circuit 10' (with respect to columns No. 1 to No. 4) become wider than that of the SAW filter circuit 1000 of the comparative example. In other words, according to the SAW filter circuit 10' of the second embodiment, the attenuation characteristics in the low-pass side attenuation band are improved over that of the comparative example. Moreover, referring to FIGS. 11 and 12, it is shown that the 3 dB band widths of the SAW filter circuit 10' (with respect to columns No. 1 to No. 4) are almost the same as that of the comparative example, which means that the pass bands of the second embodiment and the comparative example are almost the same. From the above explanation, it is obvious from this disclosure that the SAW filter circuit 10' of the second embodiment is capable of improving the attenuation characteristics in the low-pass side and the pass band.

Operational Effects

According to the second embodiment of the present invention, in the case in which the SAW filter circuit 10' is constituted by having the two-terminal pair circuit 30 composed of the resonators SR1, PR1, and PR2 serialized in the two-terminal pair circuit 31' composed of passive elements (each passive elements is an inductor or a capacitor), two of the passive elements are formed as the capacitors C2 and C3. With this structure, the SAW filter circuit 10' of the second embodiment of the present invention is capable of reducing the number of inductors in contrast to a case in which all the passive elements of the two-terminal pair circuit 3100 are formed as inductors. By the reduction in the number of inductors in which each inductance value is dependent on the length of the bonding wire, the SAW filter circuit 10' may be downsized. In this case, further reduction may be obtained when compared with a case in which one of the passive elements is formed as a capacitor (e.g. the case of the first embodiment).

Furthermore, the inductance value required by the inductor L1 may be reduced by choosing appropriate capacitance values for the capacitors C2 and C3 as shown in column No. 3 of FIG. 11. Due to this structure, the length of the bonding wire forming the inductor L1 may be reduced, and the SAW filter circuit 10' may be downsized.

Moreover, when two of the passive elements of the two-terminal pair circuit 31' are formed as the capacitors C2 and C3, the 20 dB band width in the low-pass side attenuation band shown in FIGS. 11 and 12 may be expanded, when compared with a case in which all the passive elements of the two-terminal pair circuit 3100 are formed as inductors. In other words, according to the second embodiment of the present invention, the low-pass side attenuation characteristics may be improved.

Third Embodiment

Structure

Figure 13:
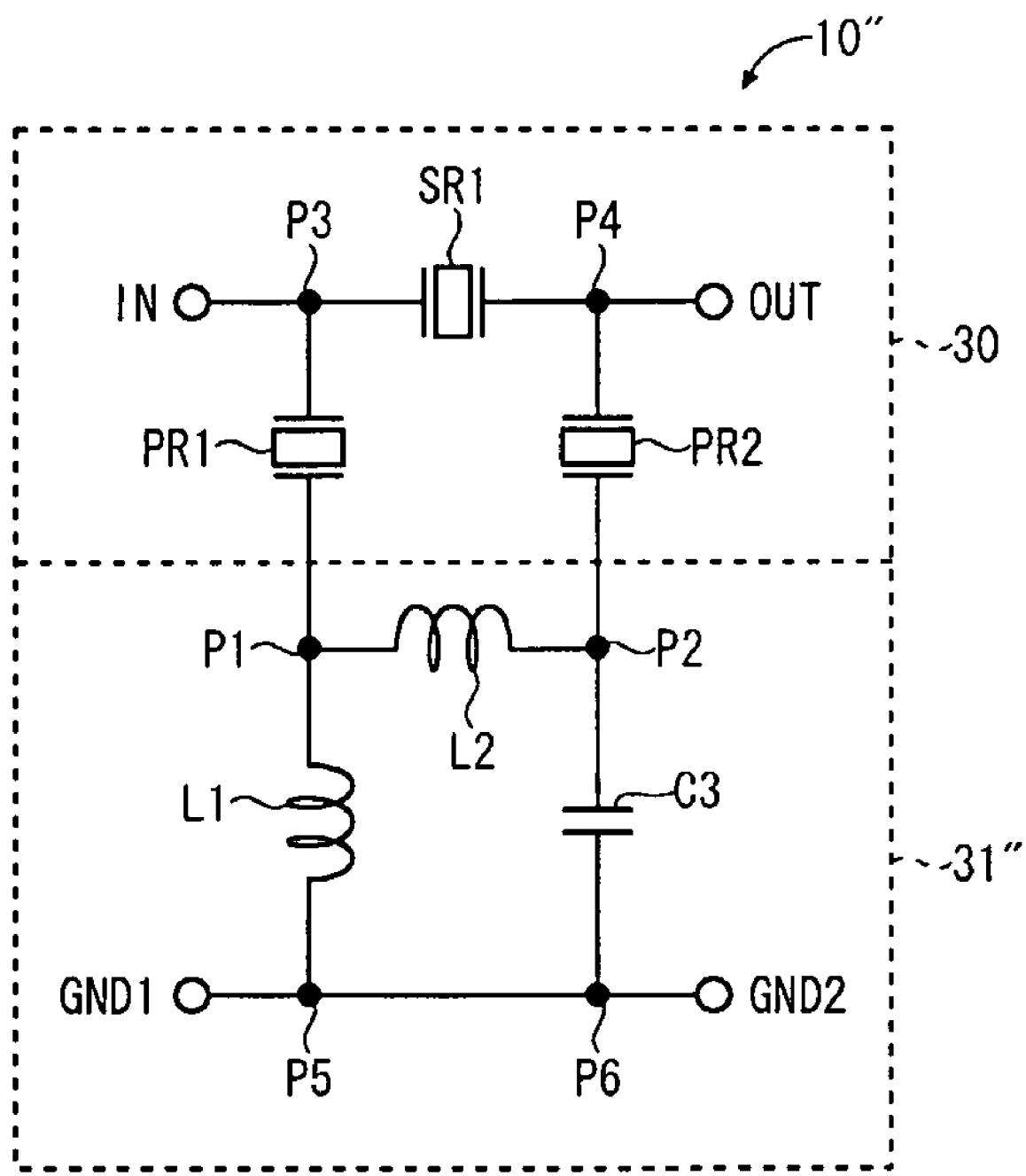
FIG. 13 is a view of a circuit diagram of a SAW filter circuit according to the third preferred embodiment of the present invention.

FIG. 13 is a circuit diagram of a SAW filter circuit 10" according to a third preferred embodiment of the present invention. The SAW filter circuit 10" according to the third embodiment has a structure similar to that of the SAW filter circuit 10 of the first embodiment shown in FIG. 1. However, in the SAW filter circuit 10" according to the third embodiment the major differences are that the capacitor C2 as used in the first embodiment shown in FIG. 1 is replaced with an inductor L2, and the inductor L3 used in the first embodiment shown in FIG. 1 is replaced with a capacitor C3 in a two-terminal pair circuit 31" as shown in FIG. 13.

Figure 14:
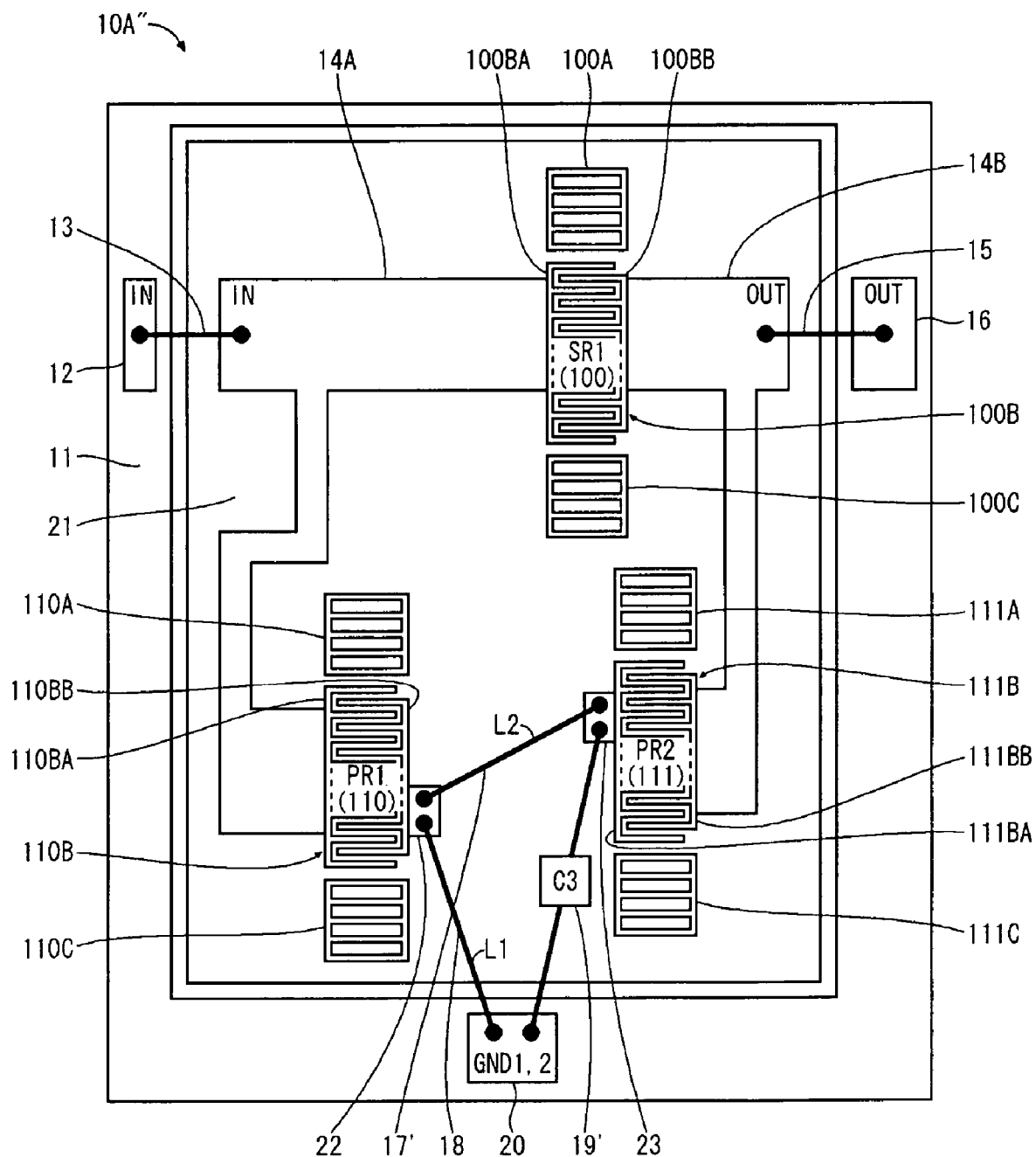
FIG. 14 is a view of a diagram showing an example of a mounted SAW filter circuit according to the third embodiment of the present invention.

FIG. 14 shows an example of a SAW filter device 10A" on which the SAW filter circuit 10" according to the third embodiment is mounted. The SAW filter device 10A" according to the third embodiment has a structure similar to that of the SAW filter device 10A according to the first embodiment shown in FIG. 2. However, in the SAW filter device 10A" according to the third embodiment the major differences are the pattern 17 to constitute the capacitor C2 and the bonding wires to connect electrically the pattern 17 to the pads 22 and 23 used in the first embodiment shown in FIG. 2 are replaced with a bonding wire 17' to constitute the inductor L2, and the bonding wire 19 to constitute the inductor L3 used in the first embodiment shown in FIG. 2 is replaced with a pattern 19' to constitute the capacitor C3 and bonding wires to connect electrically the pattern 19 to the pads 20 and 23. The capacitor C3 has the same or similar composition as that of the capacitor C2 in the first embodiment.

Simulation

The attenuation characteristics α(ω) of the SAW filter circuit 10" according to the third embodiment may also be calculated through Formulae (1) to (10). However, in the third embodiment, the capacitor C2 according to the first embodiment is replaced with the inductor L2, and the inductor L3 according to the first embodiment is replaced with the capacitor C3. Thus, with respect to Formula (6), Z2 is considered to be jωL2 (i.e. Z2=jωL2), and Z3 is considered to be −j/(ωC3) (i.e. Z3=−j/(ωC3)). For this reason, with respect to Formula (5), K2 is considered to be −j(L1/ω)(S²+ω23²) (i.e. K2=−j(L1/ω)(S²+ω23²)), ω23² is considered to be 1/{(L1+L2)*C3} (i.e. ω23²=1/{(L1+L2)*C3}), and Formula (7) is transposed to the following Formula (7-c).

$$Z_{11}(31) = \frac{S \times L1 \times L2 \times (\omega 3^2 + S^2)}{(L1 + L2) \times (\omega 2^2 + S^2)} \quad (7\text{-}c)$$

$$Z_{12}(31) = Z_{21}(31) = \frac{S \times L1}{(L1 + L2) \times (\omega 2^2 + S^2)}$$

$$Z_{22}(31) = \frac{L1 \times (\omega 1^2 + S^2)}{S \times (L1 + L2) \times (\omega 2^2 \times S^2)}$$

note:

$$\omega 1^2 = \frac{1}{L1 \times L3}$$

$$\omega 2^2 = \frac{1}{C3 \times (L1 + L2)}$$

$$\omega 3^2 = \frac{1}{L2 \times L3}$$

Figure 16:
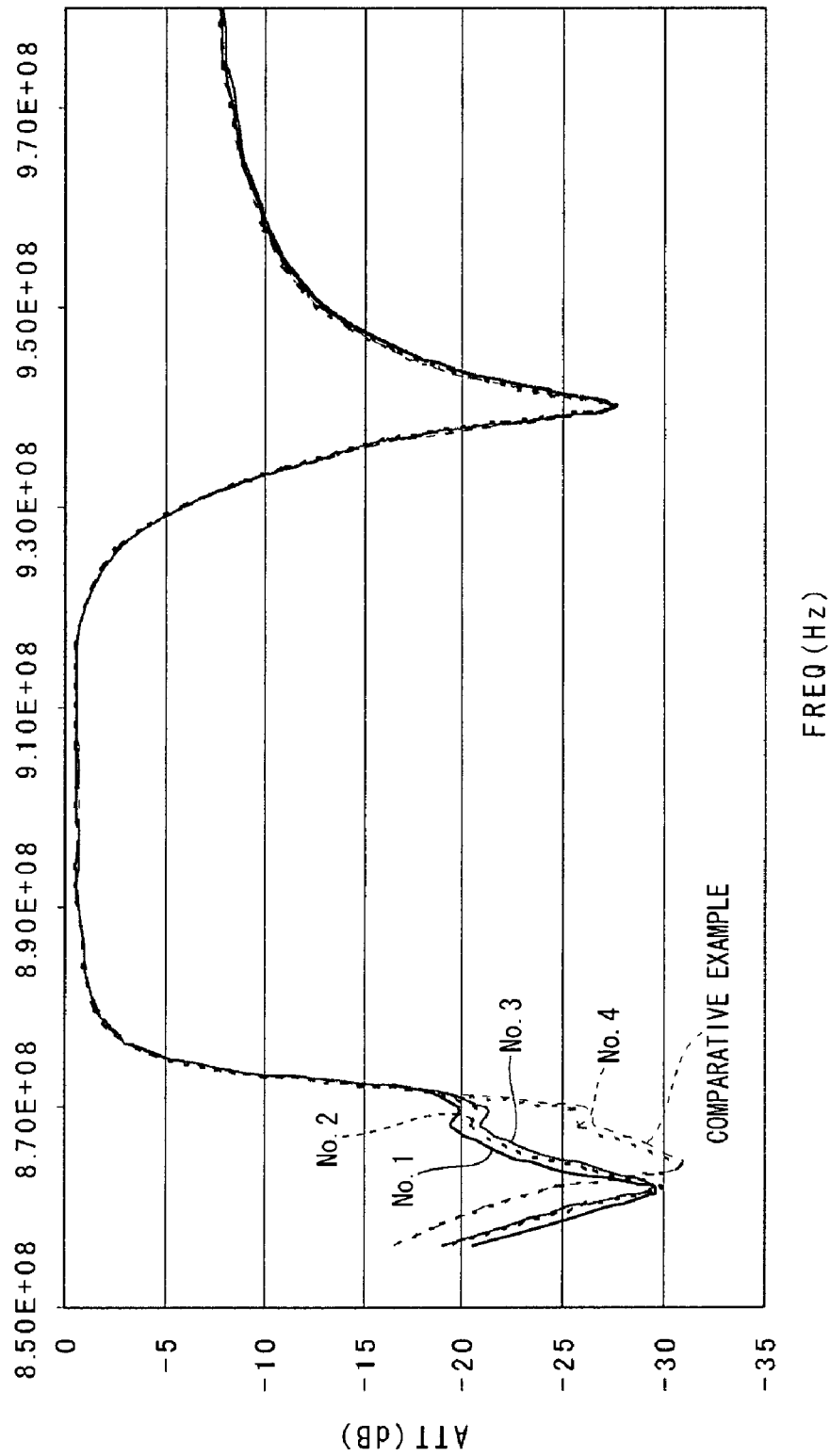
FIG. 16 is a view of a graph of a simulation result using the SAW filter according to the third embodiment of the present invention.

The results gathered from the simulation of the attenuation characteristics α(ω) of the SAW filter circuit 10" according to the third embodiment are shown in FIGS. 15 and 16. FIG. 15 numerically expresses the simulation results. FIG. 16 expresses the attenuation characteristics of the simulation results in a graph.

With respect to the simulation according to the third embodiment, the cross lengths and the number of pairs of the pectinate electrodes of the resonators SR1, PR1, and PR2 shown in FIG. 5 are used as in the case of the first embodiment. Moreover, the simulation was performed for each of the cases in which the capacitance value of the capacitor C3 and the inductance values of the inductors L1 and L2 were set as the values in columns No. 1 to No. 4 shown in FIG. 15. FIG. 15 also expresses the simulation results of the SAW filter circuit 1000 of the comparative example shown in FIG. 6.

Referring to FIGS. 15 and 16, it is shown that the 20 dB band widths in the low-pass side attenuation band of the SAW filter circuit 10" (with respect to columns No. 1 to No. 4) become wider than that of the SAW filter circuit 1000 of the comparative example. In other words, according to the SAW filter circuit 10" of the third embodiment, the attenuation characteristics in the low-pass side attenuation band are better than those of the comparative example. Moreover, referring to FIGS. 15 and 16, it is shown that the 3 dB band widths of the SAW filter circuit 10" (with respect to columns No. 1 to No. 4) are almost the same as that of the comparative example, which means that the pass bands of the first embodiment and the comparative example are almost the same. From the above explanation, it is obvious from this disclosure that the SAW filter circuit 10" of the third embodiment is capable of improving the attenuation characteristics in the low-pass side and the pass band.

Operational Effects

According to the third embodiment of the present invention, in the case in which the SAW filter circuit 10" is constituted by having the two-terminal pair circuit 30 composed of the resonators SR1, PR1, and PR2 serialized in the two-terminal pair circuit 31" composed of passive elements (each passive element is an inductor or a capacitor), one of the passive elements is formed as the capacitor C3. With this structure, the third embodiment of the present invention is capable of reducing the number of inductors in contrast to a case in which all the passive elements of the two-terminal pair circuit 3100 are formed as inductors. By the reduction in the number of inductors for which each inductance value is dependent on the length of the bonding wire, the SAW filter circuit 10″ may be downsized.

Furthermore, the inductance values required by the inductors L1 and L2 may be reduced by choosing an appropriate capacitance value for the capacitor C3 as shown in column No. 4 of FIG. 15. Due to this structure, the lengths of the bonding wires forming the inductors L1 and L2 may be reduced, and the SAW filter circuit 10″ may be downsized.

Moreover, when one of the passive elements of the two-terminal pair circuit 31″ is formed as the capacitor C3, the 20 dB band width in the low-pass side attenuation band shown in FIGS. 15 and 16 may be expanded in contrast to a case in which all the passive elements of the two-terminal pair circuit 31″ are formed with inductors. In other words, according to the third embodiment of the present invention, the low-pass side attenuation characteristics may be improved.

Fourth Embodiment

Structure

Figure 17:
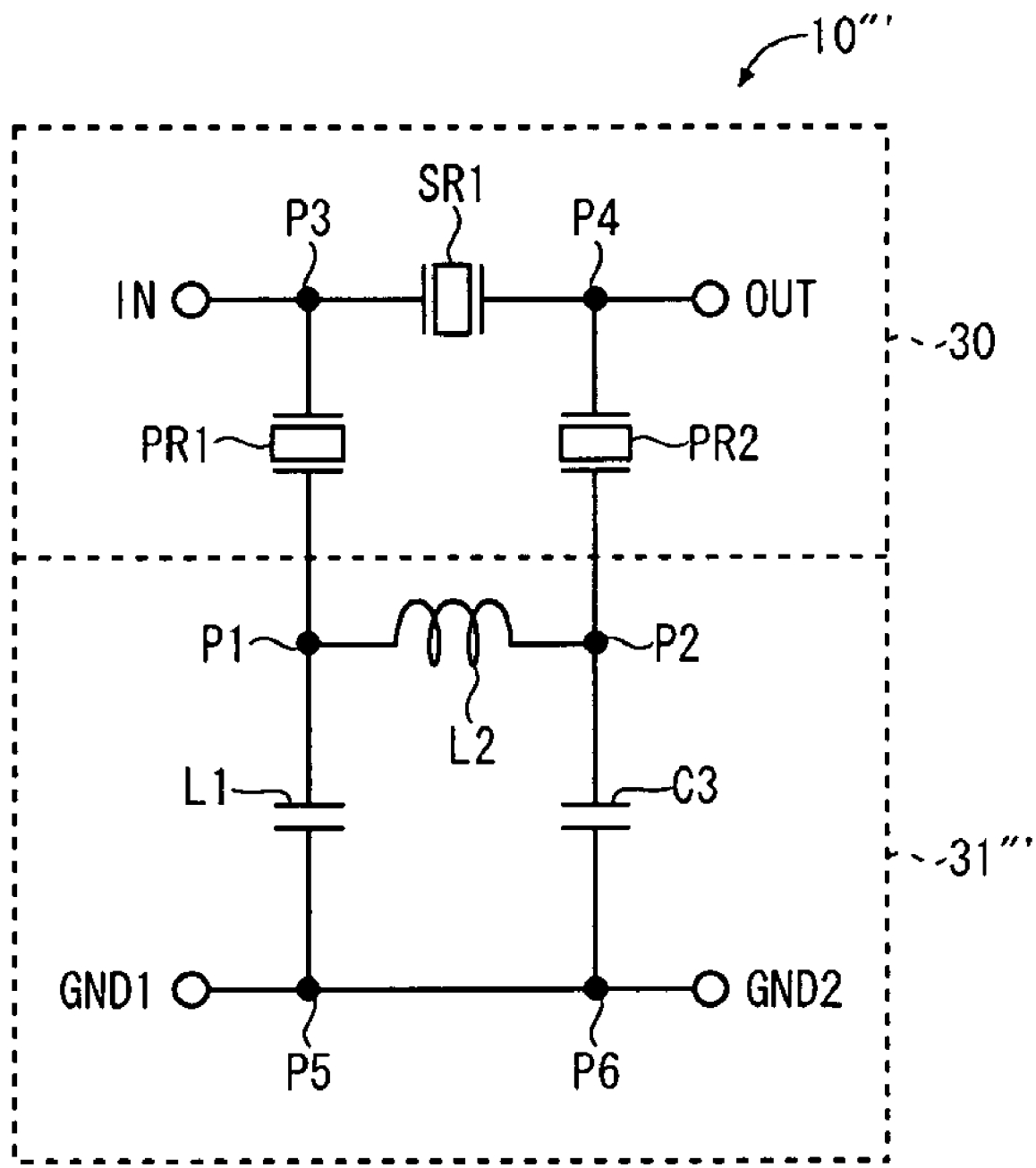
FIG. 17 is a view of a circuit diagram of a SAW filter circuit according to the fourth preferred embodiment of the present invention.

FIG. 17 is a circuit diagram of a SAW filter circuit 10‴ according to a fourth embodiment of the present invention. The SAW filter circuit 10‴ according to the fourth embodiment has a structure similar to that of the SAW filter circuit 10 of the first embodiment shown in FIG. 1. However, in the SAW filter circuit 10‴ according to the fourth embodiment, the major differences are the capacitor C2 used in the first embodiment shown in FIG. 1 is replaced with an inductor L2, and the inductors L1 and L3 used in the first embodiment shown in FIG. 1 is replaced with capacitors C1 and C3 in a two-terminal pair circuit 31‴ as shown in FIG. 17.

Figure 18:
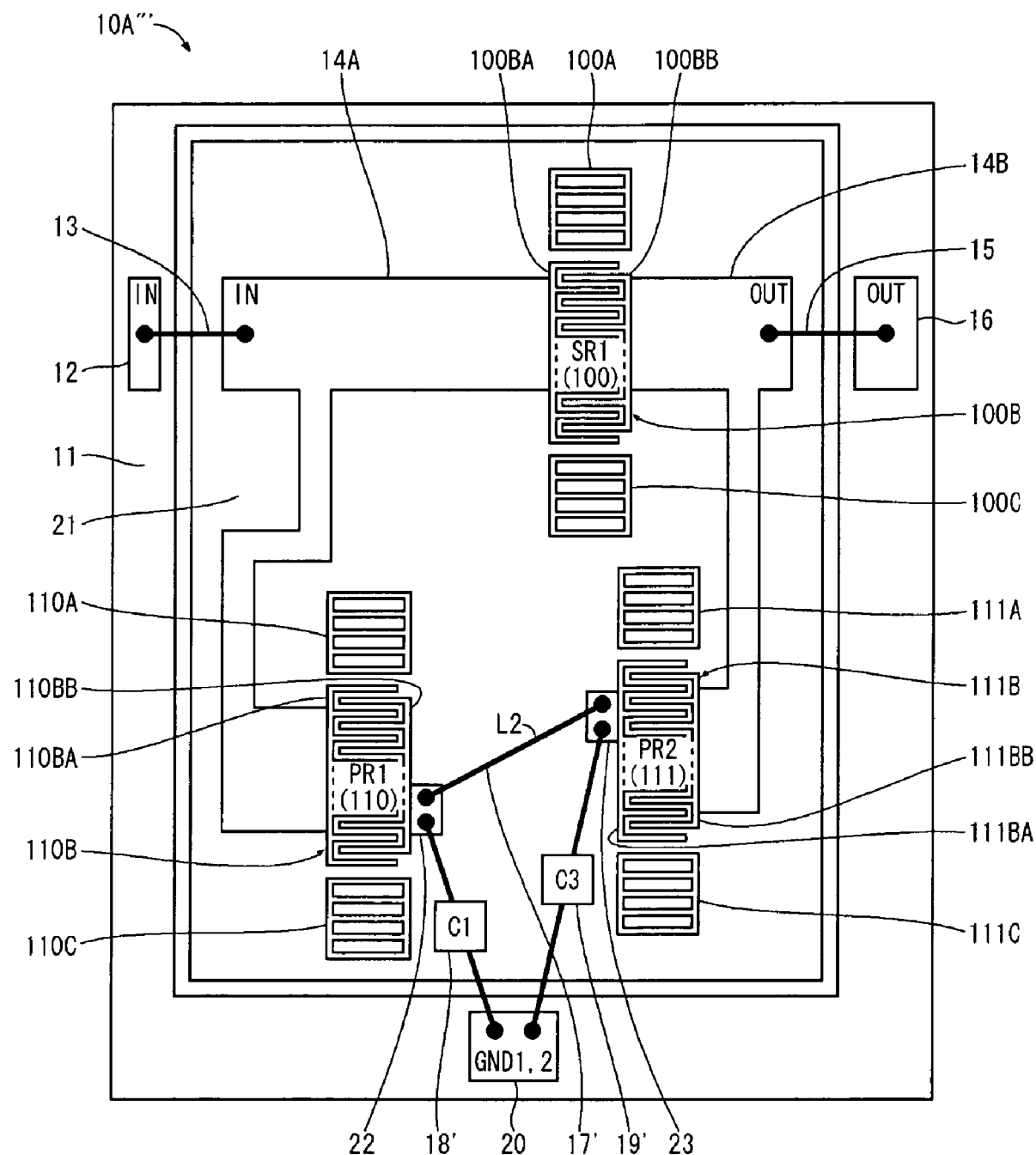
FIG. 18 is a view of a diagram showing an example of a mounted SAW filter circuit according to the fourth embodiment of the present invention.

FIG. 18 shows an example of a SAW filter device 10A‴ on which the SAW filter circuit 10‴ according to the fourth embodiment is mounted. The SAW filter device 10A‴ according to the fourth embodiment has a structure similar to that of the SAW filter device 10A according to the first embodiment shown in FIG. 2. However, in the SAW filter device 10A‴ according to the fourth embodiment, the major differences are the bonding wire 18 to constitute the inductor L1 used in the first embodiment shown in FIG. 2 is replaced with a pattern 18' to constitute the capacitor C1 and bonding wires to connect electrically the pattern 18' to the pads 20 and 22, the bonding wire 19 to constitute the inductor L3 used in the first embodiment shown in FIG. 2 is replaced with a pattern 19' to constitute the capacitor C3 and bonding wires to connect electrically the pattern 19' to the pads 20 and 22, and the pattern 17 to constitute the capacitor C2 and the bonding wires to connect electrically the pattern 17 to the pads 22 and 23 used in the first embodiment shown in FIG. 2 are replaced with a bonding wire 17' to constitute the inductor L2. The capacitors C1 and C3 constituted by the patterns 19' and 18' have the same or similar composition as that of the capacitor C2 in the first embodiment.

Simulation

The attenuation characteristics $\alpha(\omega)$ of the SAW filter circuit 10‴ according to the fourth embodiment may also be calculated by Formulae (1) to (10). However, in the fourth embodiment, the inductors L1 and L3 according to the first embodiment are replaced with the capacitors C1 and C3, and the capacitor C2 according to the first embodiment is replaced with the inductor L2. Thus, with respect to Formula (6), Z1 is considered to be $-j/(\omega C1)$ (i.e. $Z1=-j/(\omega C1)$), Z2 is considered to be $j\omega L2$ (i.e. $Z2=j\omega L2$), and Z3 is considered to be $-j/(\omega C3)$ (i.e. $Z3=-j/(\omega C3)$). For this reason, Formula (7) is transposed to the following Formula (7-d).

$$Z_{11}(31) = \frac{K1}{S \times C1 \times K0} \tag{7-d}$$

$$Z_{12}(31) = Z_{21}(31) = \frac{1}{S \times L2 \times C1 \times C3 \times K0}$$

$$Z_{22}(31) = \frac{K1}{S \times C3 \times K0}$$

note:

$$K0 = S^2 + \omega 23^2$$

$$\omega 23^2 = \frac{C1 + C3}{L2 \times C1 \times C3}$$

$$K1 = S^2 + \omega 13^2$$

$$\omega 13^2 = \frac{1}{L2 \times C3}$$

Figure 20:
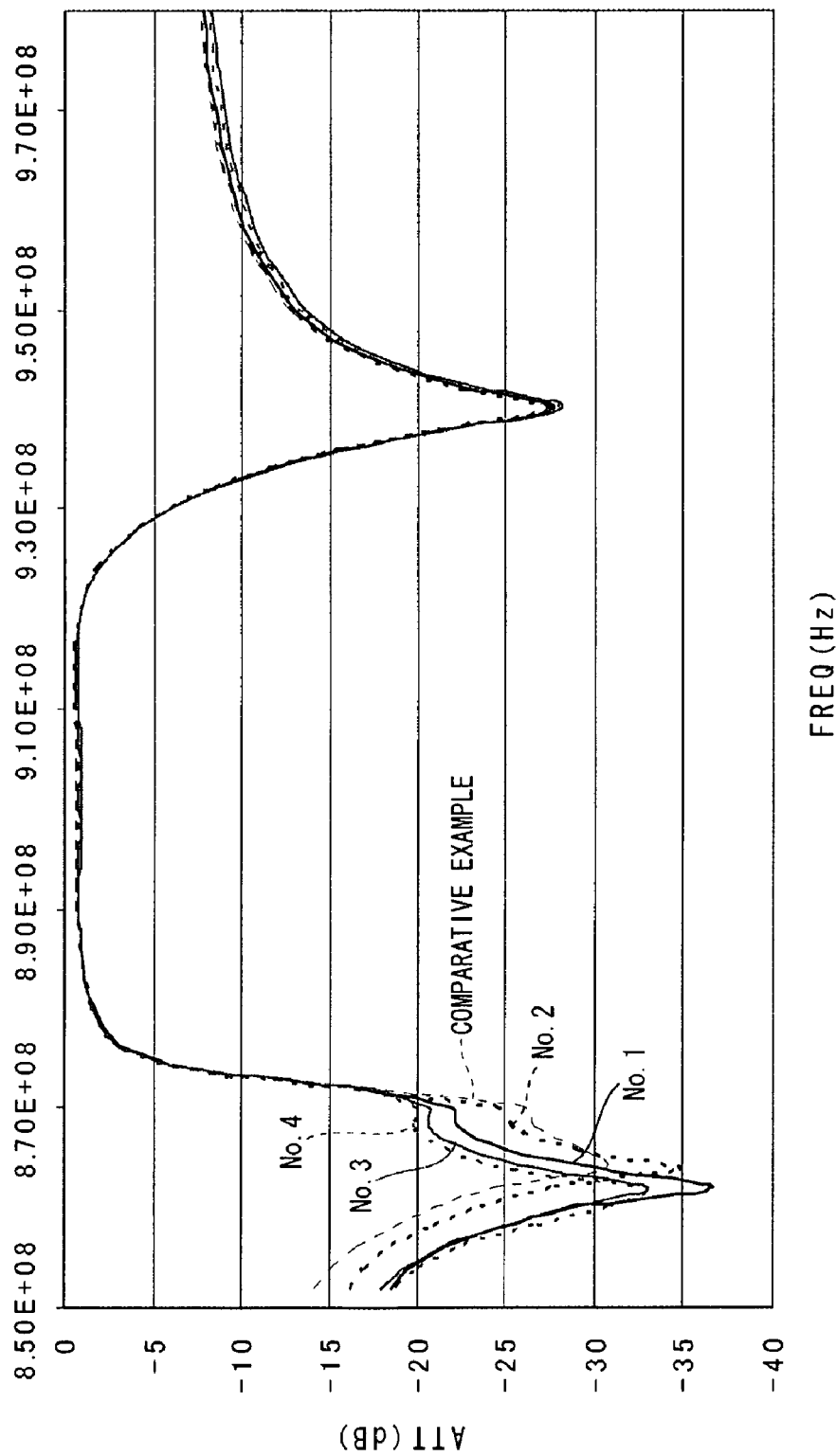
FIG. 20 is view of a graph of a simulation result using the SAW filter according to the fourth embodiment of the present invention.

The results obtained from the simulation of the attenuation characteristics $\alpha(\omega)$ of the SAW filter circuit 10‴ according to the fourth embodiment are shown in FIGS. 19 and 20. FIG. 19 numerically expresses the simulation results. FIG. 20 expresses the attenuation characteristics of the simulation results in a graph.

With respect to the simulation according to the fourth embodiment, the cross lengths and the number of pairs of the pectinate electrodes of the resonators SR1, PR1, and PR2 shown in FIG. 5 are used as in the case of the first embodiment. Moreover, the simulation was performed for each case in which the inductance value of the inductor L2 and the capacitance values of the capacitors C1 and C3 were set as the values in columns No. 1 to No. 4 shown in FIG. 19. FIG. 19 also expresses the simulation result of the SAW filter circuit 1000 of the comparative example shown in FIG. 6.

Referring to FIGS. 19 and 20, it is shown that the 20 dB band widths in the low-pass side attenuation band of the SAW filter circuit 10‴ (with respect to columns No. 1 to No. 4) become wider than that of the SAW filter circuit 1000 of the comparative example. In other words, according to the SAW filter circuit 10‴ of the fourth embodiment, the attenuation characteristics in the low-pass side attenuation band are better than those of the comparative example. Moreover, referring to FIGS. 19 and 20, it is shown that the 3 dB band widths of the SAW filter circuit 10‴ (with respect to columns No. 1 to No. 4) are almost the same as that of the comparative example, which means that the pass bands of the first embodiment and the comparative example are almost the same. From the above explanation, it is obvious from this disclosure that the SAW filter circuit 10‴ of the fourth embodiment is capable of improving the attenuation characteristics in the low-pass side and the pass band.

Operational Effects

According to the fourth embodiment of the present invention, in the case in which the SAW filter circuit 10‴ is constituted by having the two-terminal pair circuit 30 composed of the resonators SR1, PR1, and PR2 serialized to the two-terminal pair circuit 31‴ composed of passive elements (each passive element is an inductor or a capacitor), two of the passive elements are formed as the capacitors C1 and C3. With this structure, the SAW filter 10‴ of the fourth embodiment of the present invention is capable of reducing the number of inductors in contrast to a case in which all the passive elements of the two-terminal pair circuit 3100 are formed as inductors. By the reduction in the number of inductors in which each inductance value is dependent on the length of the bonding wire, the SAW filter circuit 10‴ may be downsized. In this case, further reduction may be obtained in contrast to a case in which one of the passive elements is formed as the capacitor.

Furthermore, when two of the passive elements of the two-terminal pair circuit 31''' are formed as the capacitors C1 and C3, the 20 dB band width in the low-pass side attenuation band shown in FIGS. 19 and 20 may be expanded, in contrast to a case in which all the passive elements of the two-terminal pair circuit 3100 are formed as inductors. In other words, according to the SAW filter circuit 10''' of the fourth embodiment of the present invention, the low-pass side attenuation characteristics may be improved.

Other Embodiments

The constitution of each of the SAW filters circuits 10 to 10''' according to the first to fourth embodiments of the present invention may be serialized. For example, the SAW filter circuit 10 according to the first embodiment of the present invention may be serialized as in the manner shown in FIG. 8.

This SAW filter circuit 10S shown in FIG. 8 has the structure of the SAW filter circuit 10 according to the first embodiment shown in FIG. 1, but further has a resonator SR2, a resonator PR3, a capacitor C4, an inductor L5, and connecting points P7 to P9. The resonator SR2 is a serial arm resonator disposed in the serial arm that has the connecting points P4 and P8 in a two-terminal circuit 30S. Further, the resonator SR2 is electrically connected to the resonators SR1 and PR2 through the connecting point P4 while being electrically connected to the output terminal OUT and the resonator PR3 through the connecting point P8. The resonator PR3 is a parallel arm resonator disposed in the parallel arm which has the connecting points P8, P7, and P9. Further, the resonator PR3 is electrically connected to the resonator SR2 and the output terminal OUT through the connecting point P8 while being electrically connected to the capacitor C4 and the inductor L5 through the connecting point P7. The capacitor C4 is disposed in the serial arm that has the connecting points P1, P2, and P7 in a two-terminal circuit 31S. Further, the capacitor C4 is electrically connected to the resonator PR2 and the inductor L3 through the connecting point P2 while being electrically connected to the resonator PR3 and the inductor L5 through the connecting point P7. The inductor L5 is disposed in the parallel arm that has the connecting points P8, P7, and P9. Further, the inductor L5 is electrically connected to the resonator PR3 and the capacitor C4 through the connecting point P7 while being electrically connected to the ground GND2 through the connecting point P9. Furthermore, the grounds GND1 and GND2 are electrically short-circuited through the connecting points P5, P6, and P9.

With the above-mentioned composition, the capacitor C2 is assigned to the resonators SR1, PR1, and PR2, and the capacitor C4 is assigned to the resonators SR2, PR2, and PR3. More specifically, at least one capacitor is assigned per three resonators. Due to this structure, in contrast to a to the circuit of Japanese Laid-Open Patent Publication 2003-101384 in which the capacitor is disposed only between the ground side of the parallel arm resonator located on the input stage and the ground side of the parallel arm resonator located on the output stage, the capacitance value required per capacitors may be reduced.

Fifth Embodiment

Structure

Figure 21:
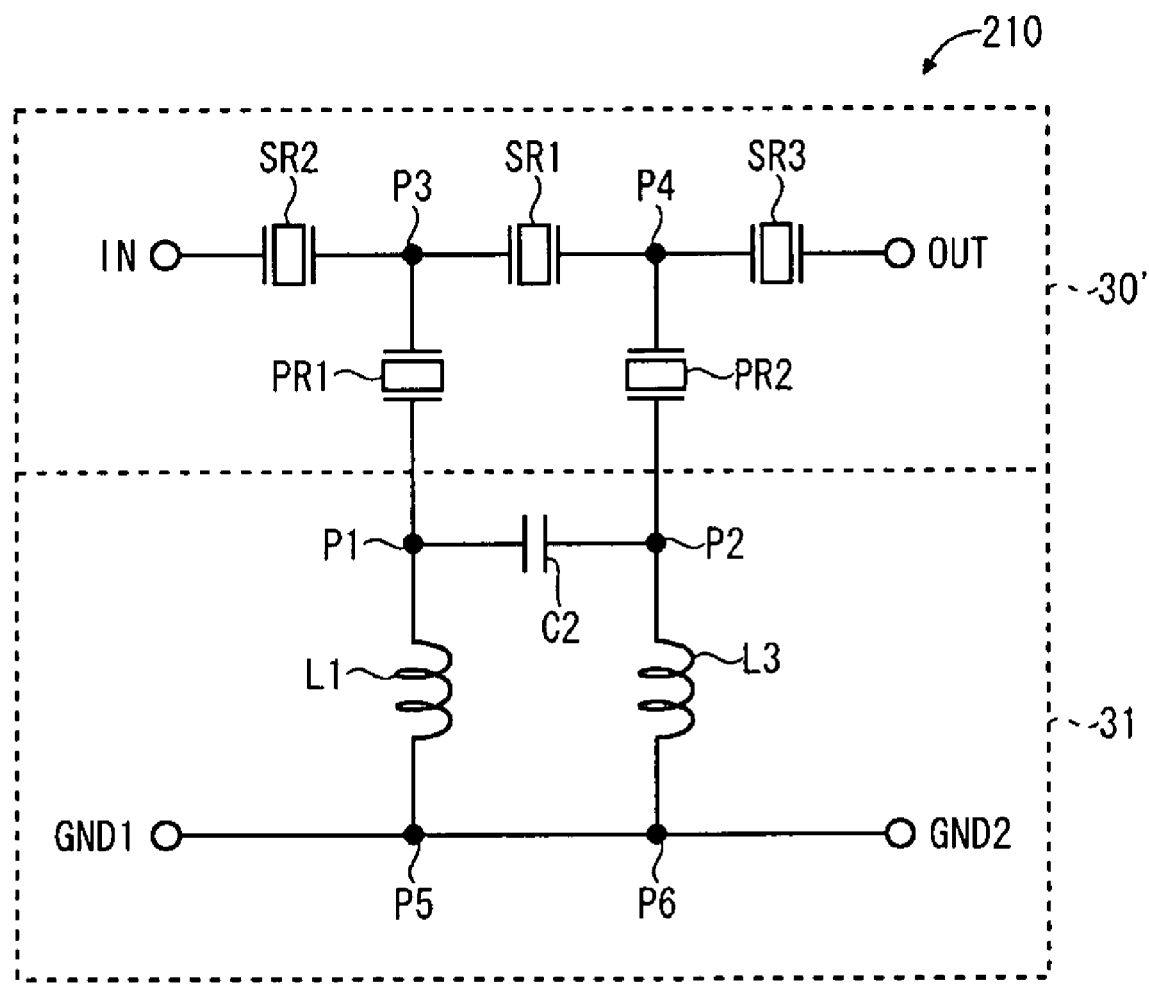
FIG. 21 is a view of a circuit diagram of a SAW filter circuit according to the fifth preferred embodiment of the present invention.

FIG. 21 is a circuit diagram of a SAW filter circuit 210 according to a fifth preferred embodiment of the present invention.

The SAW filter circuit 210 according to the fifth embodiment has a structure similar to that of the SAW filter circuit 10 according to the first embodiment shown in FIG. 1. However, the major difference between them is that the SAW filter circuit 210 further has a resonator SR2 disposed between the input terminal IN and the connecting point P3 and a resonator SR3 disposed between the output terminal OUT and the connecting point P4 in a two-terminal pair circuit 30' as shown in FIG. 21.

Figure 22:
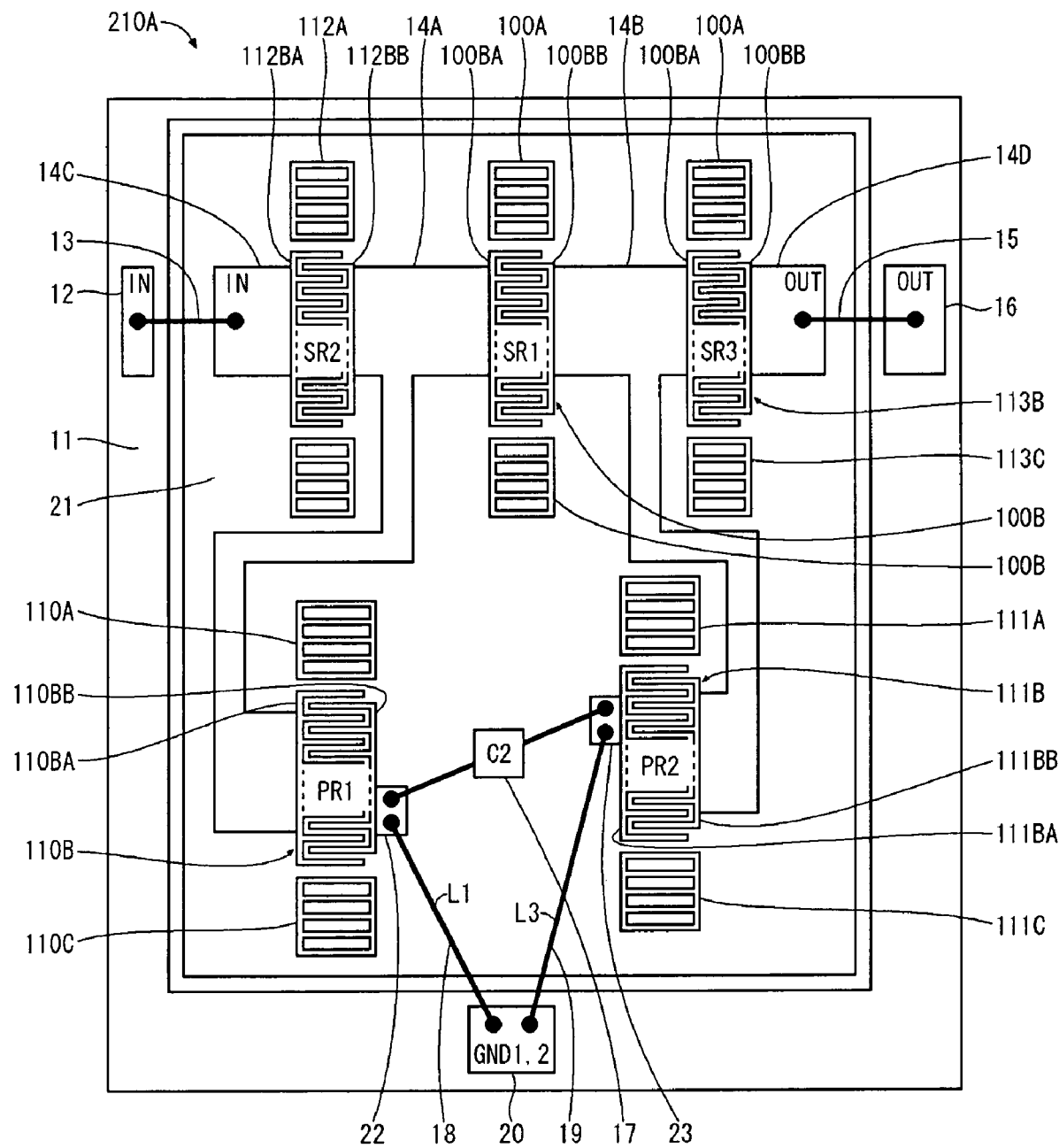
FIG. 22 is a view of a diagram showing an example of a mounted SAW filter circuit according to the fifth embodiment of the present invention.

FIG. 22 shows an example of a SAW filter device 210A on which the SAW filter circuit 210 according to the fifth embodiment is mounted. The SAW filter device 210A according to the fifth embodiment has a structure similar to that of the SAW filter device 10A according to the first embodiment shown in FIG. 2, with the major differences being that the SAW filter device 210A further has resonators SR2 and SR3 and wiring patterns 14C and 14D. The resonators SR2 and SR3, and wiring patterns 14C and 14D are formed as patterns on the piezoelectric substrate 21.

The resonator SR2 is equipped with an IDT 112B which is made of pectinate electrodes 112BA and 112BB, and grating reflectors 112A and 112C arranged on both sides of the IDT 112B. The resonator SR3 is equipped with an IDT 113B that is made of pectinate electrodes 113BA and 113BB, and grating reflectors 113A and 113C arranged on both sides of the IDT 113B.

The wiring patterns 14C and 14D are, for example, preferably made of tungsten (W). In the resonator SR2, the pectinate electrode 112BA is connected to the wiring pattern 14C, and the pectinate electrode 112BB is connected to the wiring pattern 14A. In the resonator SR3, the pectinate electrode 113BA is connected to the wiring electrode 14B and the pectinate electrode 113BB is connected to the wiring pattern 14D.

The wiring pattern 14C is connected to the pad 12 by the bonding wire 13. Further, the wiring pattern 14D is connected to the pad 16 by the bonding wire 15.

Simulation (Simulation Principle)

1. SAW Filter of the Fifth Embodiment

The attenuation characteristics $\alpha(\omega)$ of the SAW filter circuit 210 according to the fifth embodiment may also be calculated through Formulae (1) to (10) as with the first embodiment. However, in the fifth embodiment, the resonators SR2 and SR3 are added. So, Formulae (2) and (3) are transposed to following Formulae (2-a) and (3-a). In Formula (3-a), Z(SR3) is the impedance of the resonator SR1, Z(SR2) is the impedance of the resonator SR2, Z(SR3) is the impedance of the resonator (SR3), Y(PR1) is the admittance of the resonator PR1, and Z(PR2) is the admittance of the resonator PR2. A, B, C, D, and K1 are given by Formula (3-a).

$$Z(30) = \begin{bmatrix} Z_{11} & Z_{12} \\ Z_{21} & Z_{22} \end{bmatrix} \quad (2\text{-a})$$

$$Z_{11} = Z_{11}(30)$$
$$Z_{12} = Z_{12}(30)$$
$$Z_{21} = Z_{21}(30)$$
$$Z_{22} = Z_{22}(30)$$

$$Z_{11}(30) = \frac{A}{C}$$

$$Z_{12}(30) = \frac{ABS(K)}{C}$$

-continued $$Z_{21}(30) = \frac{1}{C}$$

$$Z_{22}(30) = \frac{D}{C}$$

$A=1+Z(SR1)\times Y(PR1)+Y(PR2)\times\{Z(SR2)+Z(SR1)\times(1+Z(SR2)\times Y(PR1))\}$ $B=Z(SR2)+Z(SR1)\times(1+Z(SR2)\times Y(PR1))+Z(SR3)\times[1+Z(SR2)\times Y(PR1)+Y(PR2)\times\{Z(SR2)+Z(PR3)\times(1+Z(SR2)\times Y(PR1))\}]$ $C=Y(PR1)+Y(PR2)\times(1+Z(SR2)\times Y(PR1))$ $D=1+Z(SR1)\times Y(PR1)+Z(SR3)\times\{Y(PR1)+Y(PR2)\times(1+Z(SR1\times Y(PR1))\}]$ $K=A\times D-B\times C$ \hfill (3-a)

1. SAW Filter of Comparative Example

Figure 23:
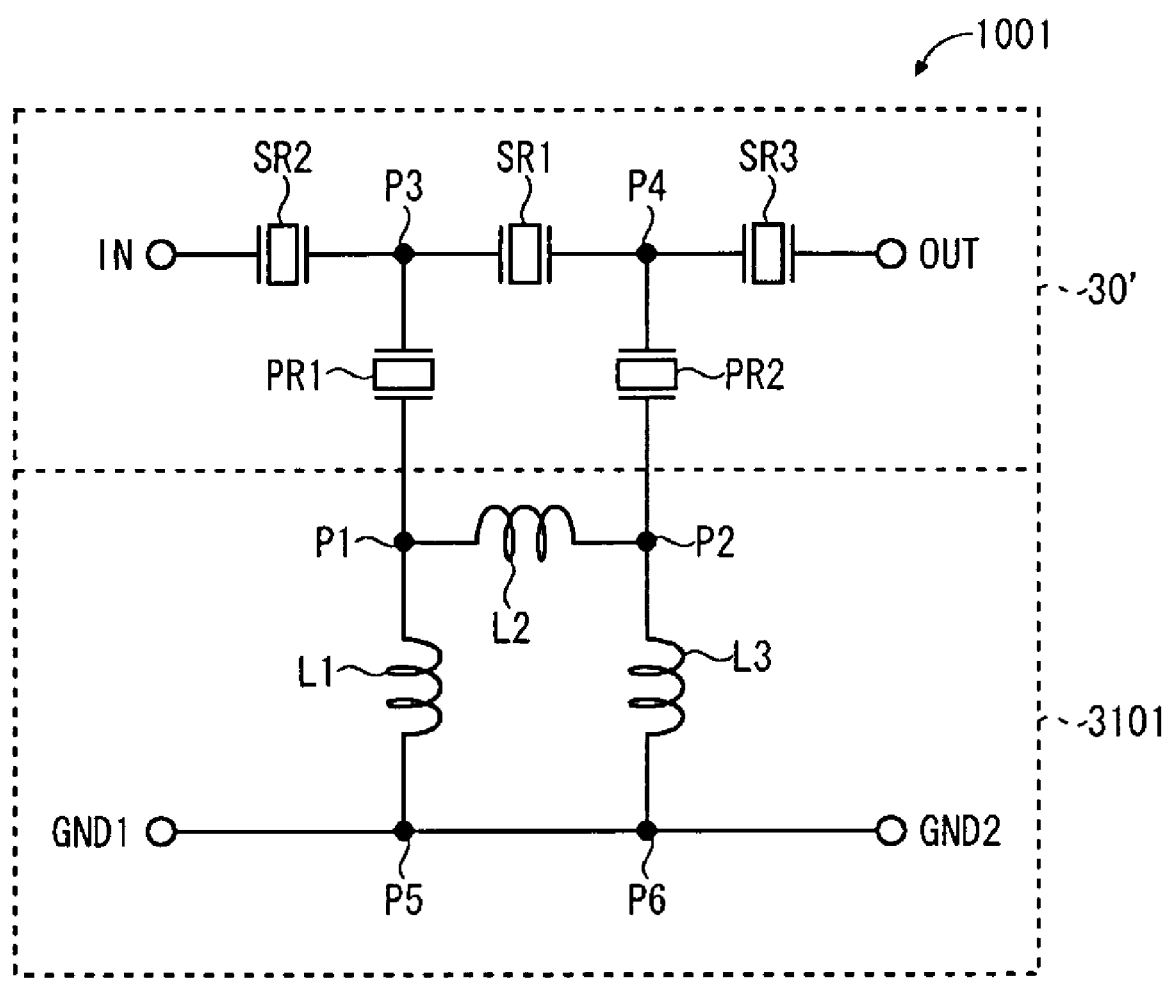
FIG. 23 is a view of a circuit diagram of a SAW filter circuit according to another comparative example.

A SAW filter circuit 1001 of a comparative example has a circuit composition as shown in FIG. 23. The SAW filter circuit 1001 has a structure similar to that of the circuit shown in FIG. 21, but in the SAW filter circuit 1001, the capacitor C2 used in the circuit of FIG. 21 is replaced with an inductor L2. In other words, a case in which all the elements that constitute a two-terminal pair circuit 3101 are inductors is assumed. The attenuation characteristics of the SAW filter circuit 1001 may also be calculated using Formulae (1), (2-a), (3-a), and (4) to (10). However, with respect to Formula (6), Z2 is considered to be jωL2 (i.e. Z2=jωL2), and Formula (7) is transposed to the following Formula (7-a) as with the case of the first embodiment.

(Simulation Result)

Figure 26:
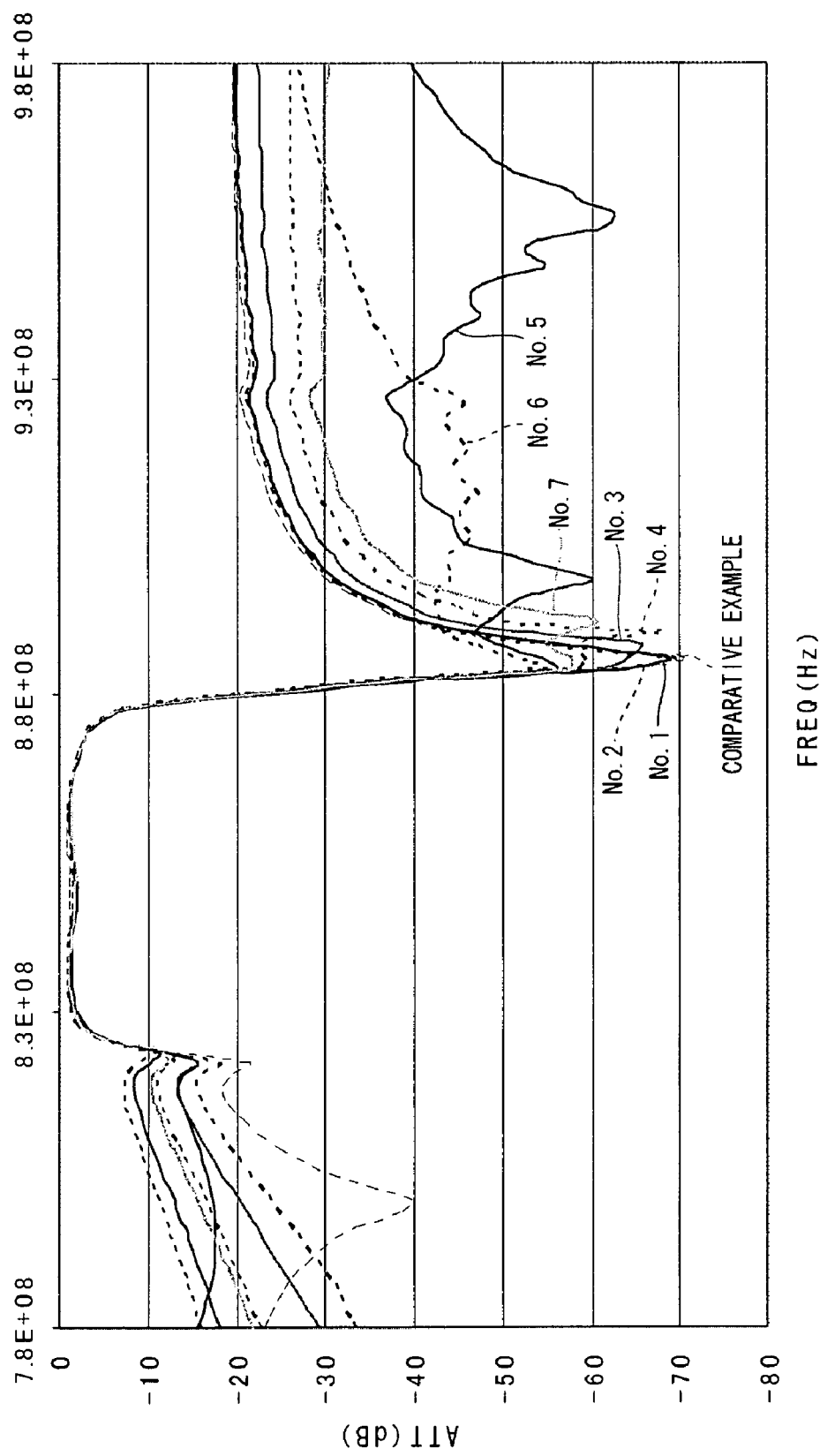
FIG. 26 is a view of a graph of a simulation result using the SAW filter according to the fifth embodiment of the present invention.

Cross lengths and number of pairs of the pectinate electrode of the resonators SR1, SR2, SR3, PR1, and PR2 used for the simulation are shown in FIG. 24. As shown in FIG. 24, with respect to the resonator SR1, a cross length was set to 600 micrometers and the number of pairs of the pectinate electrodes was set to 80. Further, with respect to the resonators SR2 and SR3, a cross length was set to 120 micrometers and a number of pairs of the pectinate electrodes was set to 100, respectively. Moreover, the simulation was performed for each case in which the capacitance value of the capacitor C2 and the inductance values of the inductors L1 and L3 were set as the values in columns No. 1 to No. 7 shown in FIG. 25, and for the comparative example. In the SAW filter circuit 1001 of the comparative example, L1, L2, and L3 are 0.2 nH (i.e. L1=L2=L3=0.2 nH). FIG. 25 also numerically expresses the simulation results. FIG. 26 expresses the attenuation characteristics of the simulation results in a graph.

In FIG. 25, 30 dB (−) is a frequency value of a lower frequency in the band where the value of attenuation is less than −30 dB in a high-pass side attenuation band, and 30 dB (+) is a frequency value of a higher frequency in the band where the value of attenuation is less than −30 dB in the high-pass side attenuation band. A 30 dB band width is a difference between the frequency of 30 dB (+) and the frequency of 30 dB (−), and it is the band width of the band where the amount of attenuation that is less than −30 dB may be secured in the high-pass side attenuation band. 3 dB (−) is a frequency value of a lower frequency in the band for which the value of attenuation is more than −3 dB, and 3 dB (+) is a frequency value of a higher frequency in the band where the value of attenuation is more than −3 dB. The 3 dB band width is a difference between the frequency of 3 dB (+) and the frequency of 3 dB (−), and shows a band width of a pass band.

Referring to FIGS. 25 and 26, it is shown that the 30 dB band widths in the high-pass side attenuation band of the SAW filter circuit 210 (with respect to No. 1 to No. 7) become wider than that of the SAW filter circuit 1001 of the comparative example. In other words, according to the SAW filter circuit 210 of the fifth embodiment, the attenuation characteristics in the high-pass side attenuation band are better than those of the comparative example. Moreover, referring to FIGS. 25 and 26, it is shown that the 3 dB band widths of the SAW filter circuit 210 (with respect to No. 1 to No. 7) are almost the same as that of the comparative example, which means that the pass bands of the fifth embodiment and the comparative example are almost the same. From the above explanation, it is obvious from this disclosure that the SAW filter circuit 210 of the fifth embodiment is capable of improving the attenuation characteristics in the high-pass side and the pass band.

Operational Effects

According to the fifth embodiment of the present invention, in the case where the SAW filter circuit 210 is constituted by having the two-terminal pair circuit 30' composed of the resonators SR1, SR2, SR3, PR1, and PR2 serialized to the two-terminal pair circuit 31 composed of passive elements (each passive elements is an inductor or a capacitor), one of the passive elements is formed as the capacitor C2. With this structure, the fifth embodiment of the present invention is capable of reducing the number of inductors in contrast to a case in which all the passive elements of the two-terminal pair circuit 3101 are formed as inductors. By the reduction in the number of inductors for which each inductance value is dependent on the length of the bonding wire, the SAW filter circuit 210 may be downsized.

Moreover, when one of the passive elements of the two-terminal pair circuit 31 is formed as the capacitor C2, the 30 dB band width in the high-pass side attenuation band shown in FIGS. 25 and 26 may be expanded, in contrast to a case in which all the passive elements of the two-terminal pair circuit 3101 are formed as inductors. In other words, according to the fifth embodiment of the present invention, the high-pass side attenuation characteristics may be improved.

Sixth Embodiment

Structure

Figure 27:
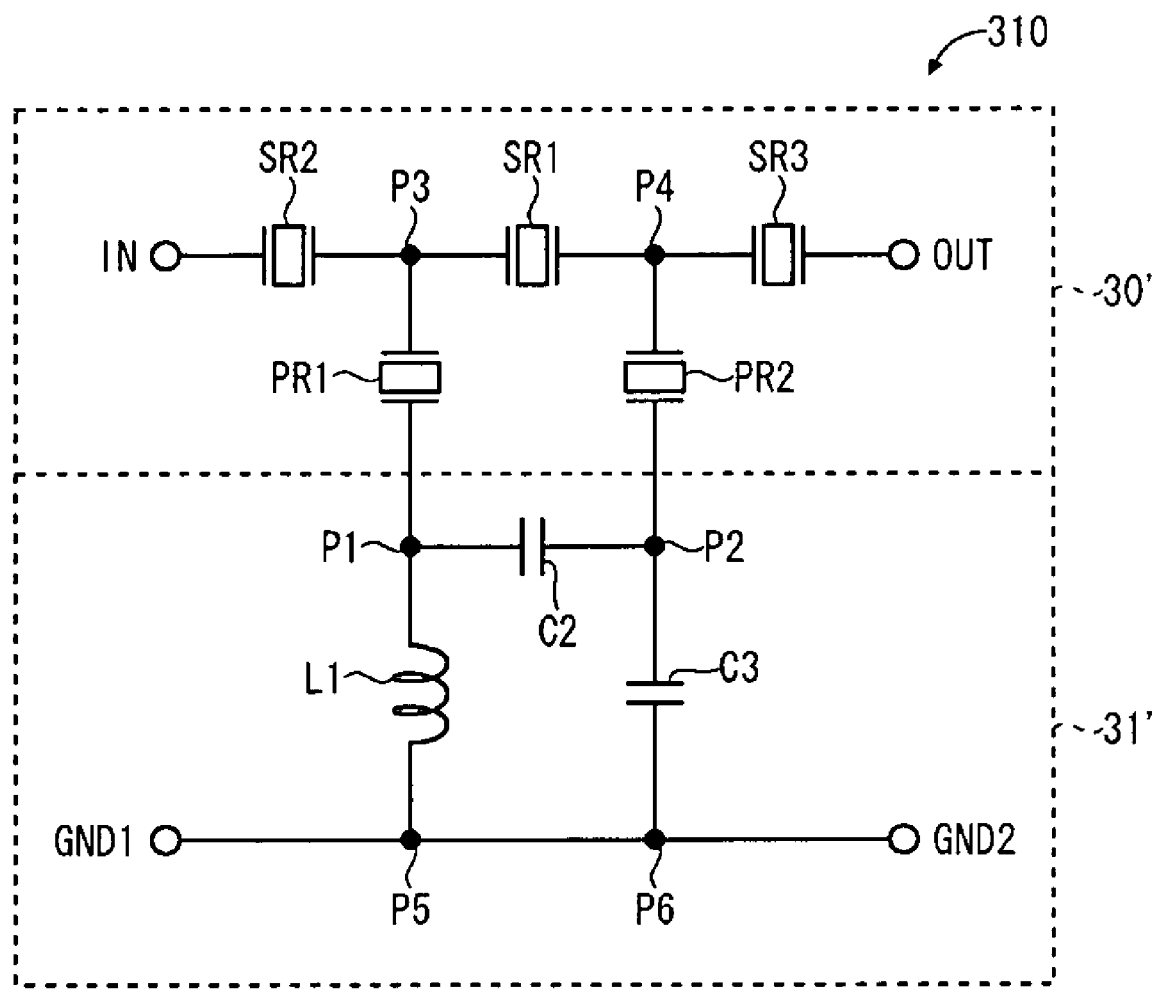
FIG. 27 is a view of a circuit diagram of a SAW filter circuit according to the sixth preferred embodiment of the present invention.

FIG. 27 is a circuit diagram of a SAW filter circuit 310 according to a sixth preferred embodiment of the present invention. The SAW filter circuit 310 according to the sixth embodiment has a structure similar to that of the SAW filter circuit 210 of the fifth embodiment shown in FIG. 21. However, in the SAW filter circuit 310 according to the sixth embodiment, the major difference is that the inductor L3 used in the fifth embodiment shown in FIG. 21 is replaced with a capacitor C3 on the two-terminal pair circuit 31' as shown in FIG. 27.

Figure 28:
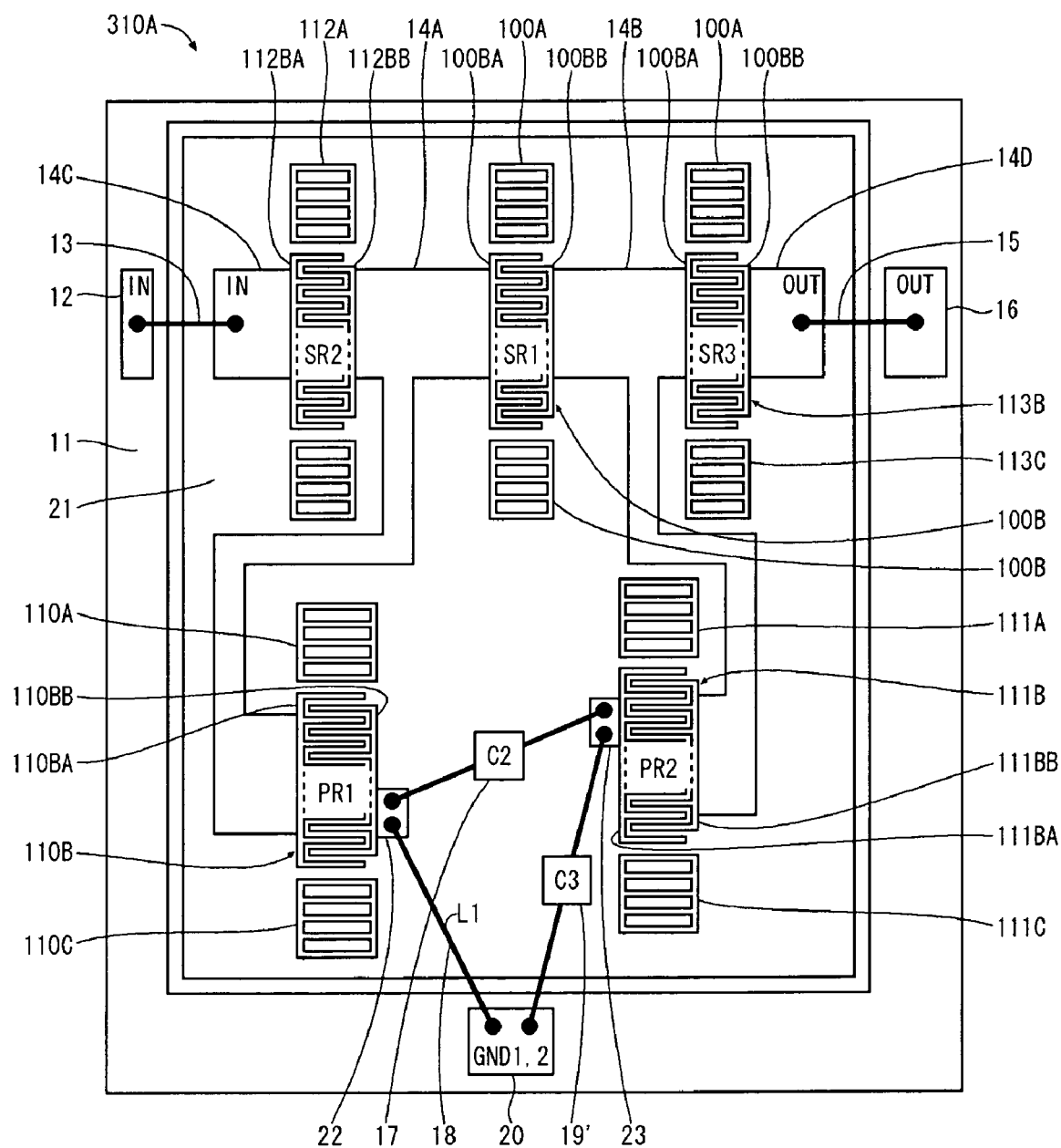
FIG. 28 is a view of a diagram showing an example of a mounted SAW filter circuit according to the sixth embodiment of the present invention.

FIG. 28 shows an example of a SAW filter device 310A in which the SAW filter circuit 310 according to the sixth embodiment is mounted. The SAW filter device 310A according to the sixth embodiment has a structure similar to that of the SAW filter device 210A according to the fifth embodiment shown in FIG. 22. However, in the SAW filter device 310A according to the sixth embodiment, the major difference is that the bonding wire 19 used in the fifth embodiment shown in FIG. 22 is replaced with a pattern 19' to constitute the capacitor C3 and bonding wires to connect electrically the pattern 19' to the pads 20 and 23. The capacitor C3 constituted with the pattern 19' has the same or similar composition as the capacitor C2 in the fifth embodiment.

Simulation (Simulation Principle)

The attenuation characteristics $\alpha(\omega)$ of the SAW filter circuit 310 according to the sixth embodiment may also be calculated through Formulae (1), (2-a), (3-a), and (4) to (10) as with the fifth embodiment. However, in the sixth embodiment, the inductor L3 according to the fifth embodiment is replaced with the capacitor C3. Thus, with respect to Formula (6), Z3 is considered to be $-j/(\omega C3)$ (i.e. $Z3 = -j/(\omega C3)$), and Formula (7) is transposed to the Formula (7-b) as with the case of the second embodiment.

(Simulation Result)

Figure 30:
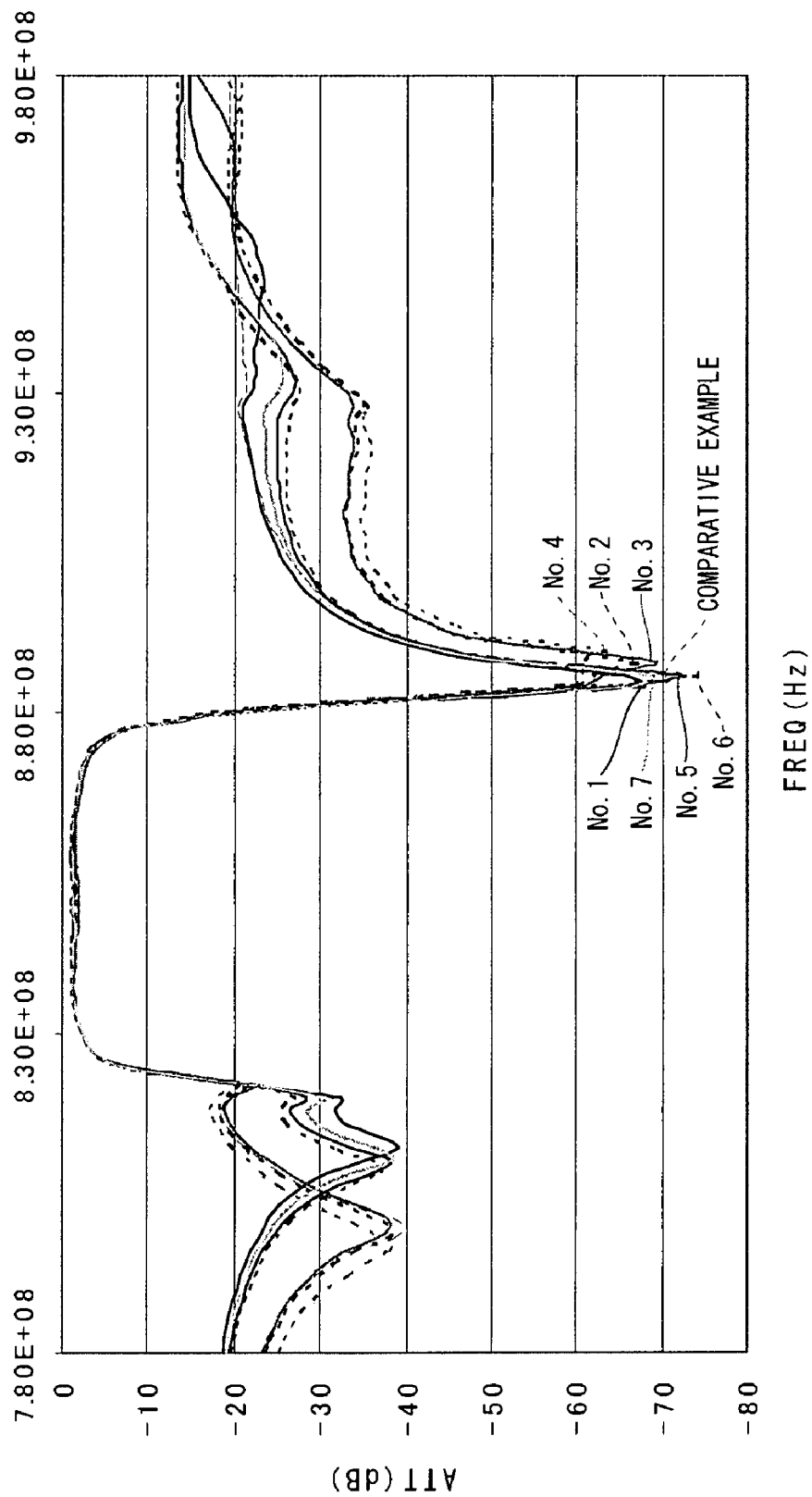
FIG. 30 is a view of a graph of simulation results using the SAW filter according to the sixth embodiment of the present invention.

The results obtained from the simulation of the attenuation characteristics $\alpha(\omega)$ of the SAW filter circuit 310 according to the sixth embodiment are shown in FIGS. 29 and 30. FIG. 29 numerically expresses the simulation results. FIG. 30 expresses the attenuation characteristics of the simulation results in a graph.

With respect to the simulation according to the sixth embodiment, the cross lengths and the number of pairs of the pectinate electrodes of the resonators SR1, SR2, SR3, PR1, and PR2 shown in FIG. 24 are used as in the case of the fifth embodiment. Moreover, the simulation was performed for each case in which the inductance value of the inductor C3 and the capacitance value of the capacitors C2 and C3 were set as the values in columns No. 1 to No. 7 shown in FIG. 29. FIG. 29 also expresses the simulation result of the SAW filter circuit 1001 of the comparative example shown in FIG. 25.

Referring to FIGS. 29 and 30, it is shown that the 30 dB band width in the high-pass side attenuation band of the SAW filter circuit 310 (with respect to columns No. 2 to No. 6) become wider than that of the SAW filter circuit 1001 of the comparative example. In other words, according to the SAW filter circuit 310 of the sixth embodiment, the attenuation characteristics in the high-pass side attenuation band are better than those of the comparative example. However, with respect to columns No. 1 and No. 7 in FIG. 29, each of the 30 dB band widths of the SAW filter circuit 310 is slightly below the 30 dB band width of the SAW filter circuit 1001, but it can be considered that such a difference is not significant. Moreover, referring to FIGS. 29 and 30, it is shown that the 3 dB band widths of the SAW filter circuit 310 (with respect to columns No. 1 to No. 7) are almost the same as that of the comparative example, which means that the pass bands of the sixth embodiment and the comparative example are almost the same. From the above explanation, it is obvious from this disclosure that the SAW filter circuit 310 of the sixth embodiment is capable of improving the attenuation characteristics in the high-pass side and the pass band.

Operational Effects

According to the sixth embodiment of the present invention, in the case where the SAW filter circuit 310 is constituted by having the two-terminal pair circuit 30' composed of the resonators SR1, SR2, SR3, PR1, and PR2 serialized to the two-terminal pair circuit 31' composed of passive elements (each passive elements is an inductor or a capacitor), two of the passive elements are formed as the capacitors C2 and C3. With this structure, the SAW filter circuit 310 of the sixth embodiment of the present invention is capable of reducing the number of inductors in contrast to a case in which all the passive elements of the two-terminal pair circuit 3101 are formed as inductors. By the reduction in the number of inductors for which each inductance value is dependent on the length of the bonding wire, the SAW filter circuit 310 may be downsized. In this case, further reduction may be obtained in contrast to a case in which one of the passive elements is formed as a capacitor (e.g. the case of the fifth embodiment).

Furthermore, the inductance value required by the inductor L1 may be reduced by choosing appropriate capacitance values for the capacitors C2 and C3 as shown in column No. 5 of FIG. 29. Given this structure, the length of the bonding wire forming the inductor L1 may be reduced, and the SAW filter circuit 310 may be downsized.

Moreover, when two of the passive elements of the two-terminal pair circuit 31' are formed as the capacitors C2 and C3, the 30 dB band width in the high-pass side attenuation band shown in FIGS. 29 and 30 may be expanded, in contrast to a case in which all the passive elements of the two-terminal pair circuit 3101 are formed as inductors. In other words, according to the sixth embodiment of the present invention, the high-pass side attenuation characteristics may be improved.

Seventh Embodiment

Structure

Figure 31:
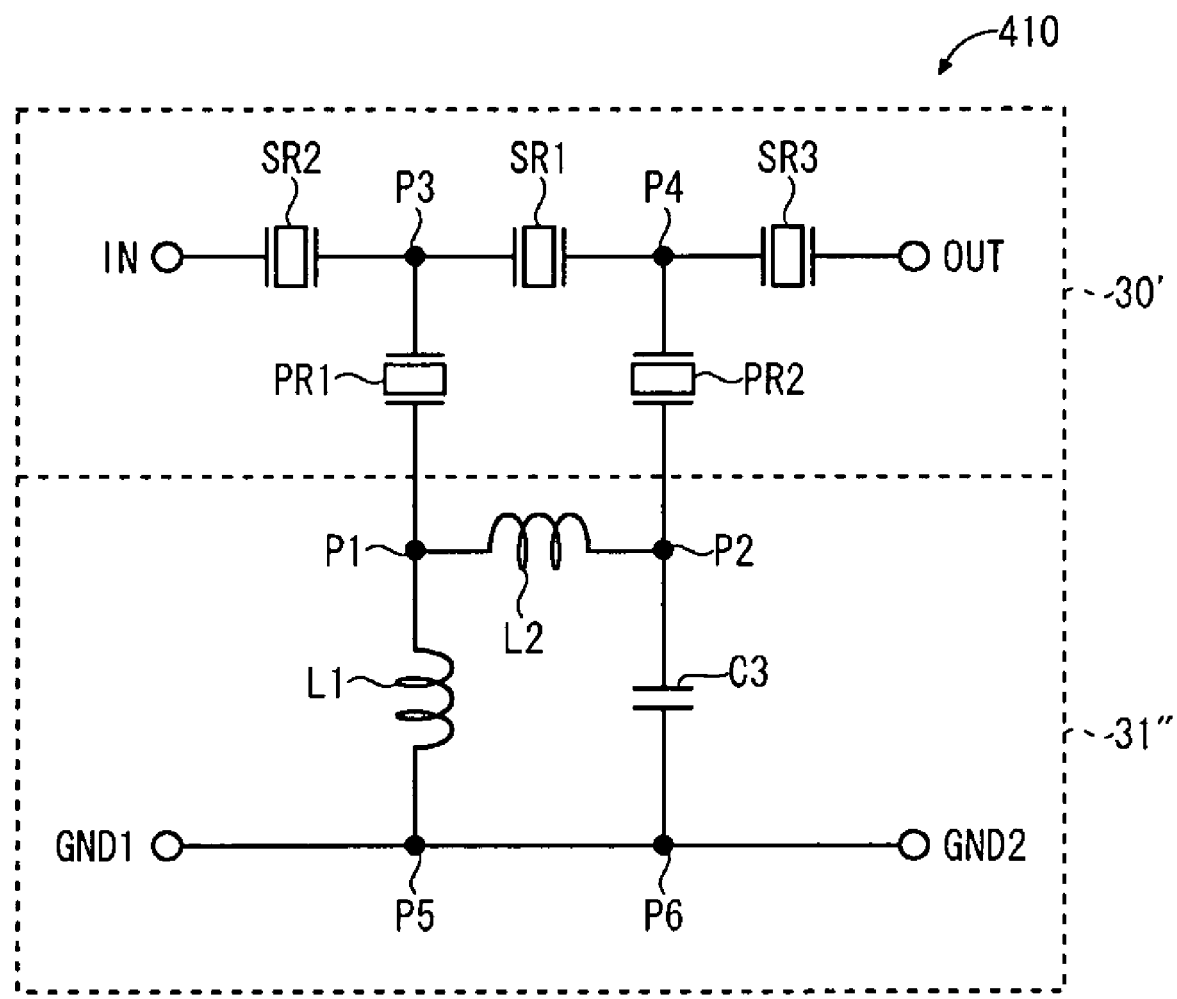
FIG. 31 is a view of a circuit diagram of a SAW filter circuit according to the seventh preferred embodiment of the present invention.

FIG. 31 is a circuit diagram of a SAW filter circuit 410 according to a seventh preferred embodiment of the present invention. The SAW filter circuit 410 according to the seventh embodiment has a structure similar to that of the SAW filter circuit 210 according to the fifth embodiment shown in FIG. 21. However, in the SAW filter circuit 410 according to the seventh embodiment, the major differences are the capacitor C2 used in the fifth embodiment shown in FIG. 21 is replaced with an inductor L2, and the inductor L3 used in the fifth embodiment shown in FIG. 21 is replaced with a capacitor C3 in the two-terminal pair circuit 31" as shown in FIG. 31.

Figure 32:
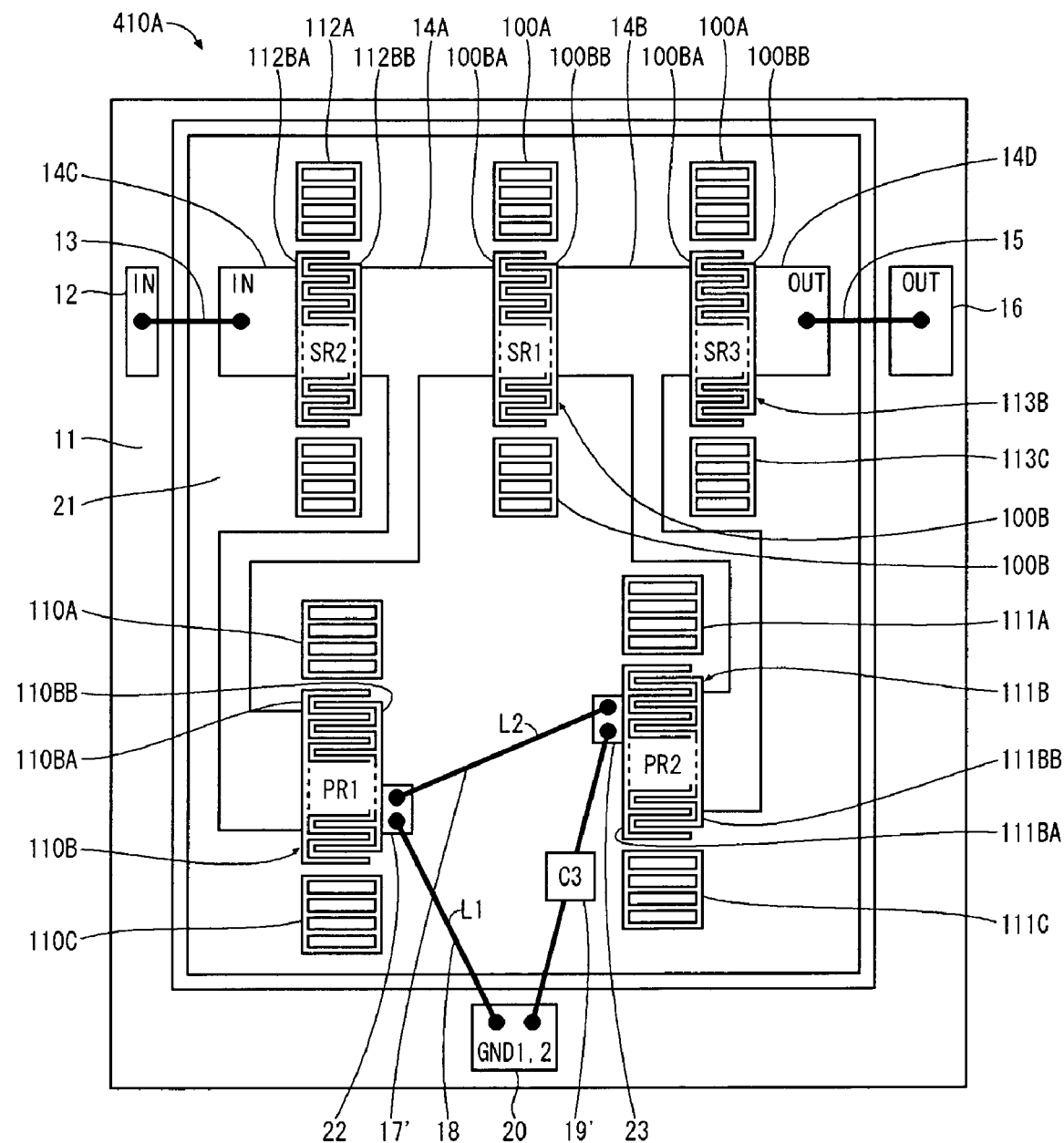
FIG. 32 is a view of a diagram showing an example of a mounted SAW filter circuit according to the seventh embodiment of the present invention.

FIG. 32 shows an example of a SAW filter device 410A on which the SAW filter circuit 410 according to the seventh embodiment is mounted. The SAW filter device 410A according to the seventh embodiment has a structure similar to that of the SAW filter circuit 210A according to the fifth embodiment shown in FIG. 22. However, in the SAW filter device 410A according to the seventh embodiment, the major differences are the pattern 19 to constitute the capacitor C2 and the bonding wires to connect electrically the pattern 17 to the pads 22 and 23 used in the fifth embodiment shown in FIG. 22 are replaced with a bonding wire 17' to constitute the inductor L2, and the bonding wire 19 to constitute the inductor L3 used in the fifth embodiment shown in FIG. 22 is replaced with a pattern 19' to constitute the capacitor C3 and bonding wires to connect electrically the pattern 19' to the pads 20 and 23.

Simulation (Simulation Principle)

The attenuation characteristics $\alpha(\omega)$) of the SAW filter circuit 410 according to the seventh embodiment may also be calculated using Formulae (1), (2-a), (3-a), and (4) to (10) as in the fifth embodiment. However, in the seventh embodiment, the capacitor C2 and the inductor L3 are respectively replaced with the inductor L2 and the capacitor C3. Thus, with respect to Formula (6), Z2 is considered to be $j\omega L2$ (i.e. $Z2 = j\omega L2$), Z3 is considered to be $-j/(\omega C3)$ (i.e. $Z3 = -j/(\omega C3)$), and Formula (7) is transposed to the Formula (7-c) as with the case of the third embodiment.

(Simulation Result)

The results obtained form the simulation of the attenuation characteristics $\alpha(\omega)$ of the SAW filter circuit 410 according to the seventh embodiment are shown in FIGS. 33 and 34. FIG. 33 numerically expresses the simulation results. FIG. 34 expresses the attenuation characteristics of the simulation results in a graph.

With respect to the simulation according to the seventh embodiment, the cross lengths and the number of pairs of the pectinate electrodes of the resonators SR1, SR2, SR3, PR1, and PR2 shown in FIG. 24 are used as in the case of the fifth embodiment. Moreover, the simulation was performed for each case in which the capacitance value of the capacitor C3 and the inductance values of the inductors L1 and L2 were set as the values in columns No. 1 to No. 7 shown in FIG. 33. FIG. 33 also expresses the simulation result of the SAW filter circuit 1001 of the comparative example shown in FIG. 25.

Referring to FIGS. 33 and 34, it is shown that the 30 dB band width in the high-pass side attenuation band of the SAW filter circuit 410 (with respect to columns No. 1 to No. 7) become wider than that of the SAW filter circuit 1001 of the comparative example. In other words, according to the SAW filter circuit 410 of the seventh embodiment, the attenuation characteristics in the high-pass side attenuation band are better than those of the comparative example. Moreover, referring to FIGS. 33 and 34, it is shown that the 3 dB band widths of the SAW filter circuit 410 (with respect to columns No. 1 to No. 7) are almost the same as that of the comparative example, which means that the pass bands of the seventh embodiment and the comparative example are almost the same. From the above explanation, it is obvious from this disclosure that the SAW filter circuit 410 of the seventh embodiment is capable of improving the attenuation characteristics in the high-pass side and the pass band.

Operational Effects

According to the seventh embodiment of the present invention, in a case in which the SAW filter circuit 410 is constituted by having the two-terminal pair circuit 30' made of the resonators SR1, SR2, SR3, PR1, and PR2 serialized to the two-terminal pair circuit 31' made of passive elements (each passive elements is an inductor or a capacitor), one of the passive elements is formed as the capacitor C2. With this structure, the seventh embodiment of the present invention is capable of reducing the number of inductors in contrast to a case in which all the passive elements of the two-terminal pair circuit 3101 are formed as inductors. By the reduction in the number of inductors where each of the inductance value is dependent on the length of the bonding wire, the SAW filter circuit 410 may be downsized.

Furthermore, the inductance values required by the inductors L1 and L2 may be reduced by choosing appropriate capacitance values for the capacitors C3 as shown in column No. 3 of FIG. 33. For this sake, the length of the bonding wire forming the inductors L1 and L2 may be reduced, and the SAW filter circuit 410 may be downsized.

Moreover, when one of the passive elements of the two-terminal pair circuit 31 is formed as the capacitor C3, the 30 dB band width in the high-pass side attenuation band shown in FIGS. 33 and 34 may be expanded, in contrast to a case in which all the passive elements of the two-terminal pair circuit 3101 are formed as inductors. In other words, according to the seventh embodiment of the present invention, the high-pass side attenuation characteristics may be improved.

As mentioned above, in accordance with the SAW filter circuits of the present invention, a plurality of attenuation poles is formed in the attenuation band due to the first to third passive elements of the second circuit. Due to this structure, the SAW filter circuits of the present invention can realize improved attenuation characteristics. Furthermore, according to the present invention, by having a structure in which at least one of the first to third passive elements is formed as a capacitor, the inductance value required by each of the inductors may be reduced in contrast to a case in which the first to third passive elements of the second circuit are all formed as inductors. Due to this structure, the length of the bonding wires forming the inductors may be reduced, and the SAW filter circuits may be downsized. Moreover, by having a structure in which at least one capacitor is assigned per three resonators that are the first to third resonators, the capacitance value required per capacitors may be reduced.

This application claims priority to Japanese Patent Applications No. 2004-182787 and No. 2004-55249. The entire disclosures of Japanese Patent Applications No. 2004-182787 and No. 2004-55249 are hereby incorporated herein by references.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A SAW filter circuit comprising:
   a first circuit having,
      first to fourth connecting points,
      a first SAW resonator being electrically connected to said first and second connecting points,
      a second SAW resonator being electrically connected to said first and third connecting points, and
      a third SAW resonator being electrically connected to said second and fourth connecting points; and
   a second circuit having,
      a fifth connecting point being electrically connected to said third connecting point,
      a sixth connecting point being electrically connected to said fourth connecting point,
      seventh and eighth connecting points being electrically short-circuited,
      a first passive element comprising a capacitor and electrically connected to said fifth and sixth connecting points, the capacitance value of said first passive element contained within a range of 22 pF to 105 pF,
      a second passive element comprising an inductor and electrically connected to said fifth and seventh connecting points, the inductance value of said second passive element contained within a range of 0.2 nH to 1.0 nH, and a third passive element comprising an inductor and electrically connected to said sixth and eighth connecting points, the inductance value of said third passive element contained within a range of 0.2 nH to 0.6 nH.

2. The SAW filter circuit according to claim 1, wherein each of said second and third passive elements is made of one or more bonding wires or one or more strip lines.

3. The SAW filter circuit according to claim 1, wherein said first passive element is an MIM capacitor or a chip capacitor.

4. A SAW filter circuit comprising:
a first circuit having,
    first to fourth connecting points,
    a first SAW resonator being electrically connected to said first and second connecting points,
    a second SAW resonator being electrically connected to said first and third connecting points, and
    a third SAW resonator being electrically connected to said second and fourth connecting points; and
a second circuit having,
    a fifth connecting point being electrically connected to said third connecting point,
    a sixth connecting point being electrically connected to said fourth connecting point,
    seventh and eighth connecting points being electrically short-circuited,
    a first passive element comprising a capacitor and electrically connected to said fifth and sixth connecting points, the capacitance value of said first passive element contained within a range of 600 pF to 800 pF,
    a second passive element comprising an inductor and electrically connected to said fifth and seventh connecting points, the inductance value of said second passive element contained within a range of 0.1 nH to 1.0 nH, and
    a third passive element comprising a capacitor and electrically connected to said sixth and eighth connecting points, the capacitance value of said third passive element contained within a range of 550 pF to 750 pF.

5. The SAW filter circuit according to claim 4, wherein said second passive element is made of one or more bonding wires or one or more strip lines.

6. The SAW filter circuit according to claim 4, wherein each of said first and third passive elements is an MIM capacitor or a chip capacitor.

7. A SAW filter circuit comprising:
a first circuit having,
    first to fourth connecting points,
    a first SAW resonator being electrically connected to said first and second connecting points,
    a second SAW resonator being electrically connected to said first and third connecting points, and
    a third SAW resonator being electrically connected to said second and fourth connecting points; and
a second circuit having,
    a fifth connecting point being electrically connected to said third connecting point,
    a sixth connecting point being electrically connected to said fourth connecting point,
    seventh and eighth connecting points being electrically short-circuited,
    a first passive element comprising an inductor and electrically connected to said fifth and sixth connecting points, the inductance value of said first passive element contained within a range of 0.1 nH to 0.5 nH,
    a second passive element comprising an inductor and electrically connected to said fifth and seventh connecting points, the inductance value of said second passive element contained within a range of 0.1 nH to 0.5 nH, and
    a third passive element comprising a capacitor and electrically connected to said sixth and eighth connecting points, the capacitance value of said third passive element contained within a range of 1.0 pF to 90 pF.

8. The SAW filter circuit according to claim 7, wherein each of said first and second passive elements is made of one or more bonding wires or one or more strip lines.

9. The SAW filter circuit according to claim 7, wherein said third passive element is an MIM capacitor or a chip capacitor.

10. A SAW filter circuit comprising:
a first circuit having,
    first to fourth connecting points,
    a first SAW resonator being electrically connected to said first and second connecting points,
    a second SAW resonator being electrically connected to said first and third connecting points, and
    a third SAW resonator being electrically connected to said second and fourth connecting points; and
a second circuit having,
    a fifth connecting point being electrically connected to said third connecting point,
    a sixth connecting point being electrically connected to said fourth connecting point,
    seventh and eighth connecting points being electrically short-circuited,
    a first passive element comprising an inductor and electrically connected to said fifth and sixth connecting points, the inductance value of said first passive element contained within a range of 0.3 nH to 1.5 nH,
    a second passive element comprising a capacitor and electrically connected to said fifth and seventh connecting points, the capacitance value of said second passive element contained within a range of 68 pF to 700 pF, and
    a third passive element comprising a capacitor and electrically connected to said sixth and eighth connecting points, the capacitance value of said third passive element contained within a range of 70 pF to 170 pF.

11. The SAW filter circuit according to claim 10, wherein said first passive element is made of one or more bonding wires or one or more strip lines.

12. The SAW filter circuit according to claim 10, wherein each of said second and third passive elements is an MIM capacitor or a chip capacitor.

13. A SAW filter circuit comprising:
a first circuit having,
    first to fourth connecting points,
    a first SAW resonator being electrically connected to said first and second connecting points,
    a second SAW resonator being electrically connected to said first and third connecting points,
    a third SAW resonator being electrically connected to said second and fourth connecting points;

a second circuit having,
a fifth connecting point being electrically connected to said third connecting point,
a sixth connecting point being electrically connected to said fourth connecting point,
seventh and eighth connecting points being electrically short-circuited,
a first passive element comprising a capacitor and electrically connected to said fifth and sixth connecting points, the capacitance value of said first passive element contained within a range of 15 pF to 55 pF,
a second passive element comprising an inductor and electrically connected to said fifth and seventh connecting points, the inductance value of said second passive element contained within a range of 0.5 nH to 2.0 nH, and
a third passive element comprising an inductor and electrically connected to said sixth and eighth connecting points, the inductance value of said third passive element contained within a range of 0.5 nH to 2.0 nH.

14. The SAW filter circuit according to claim 13, wherein each of said second and third passive elements is made of one or more bonding wires or one or more strip lines.

15. The SAW filter circuit according to claim 13, wherein said first passive element is an MIM capacitor or a chip capacitor.

16. The SAW filter circuit according to claim 13, wherein said first circuit further includes,
ninth and tenth connecting points,
a fourth SAW resonator electrically connected to said first and ninth connecting points, and
a fifth SAW resonator electrically connected to said second and tenth connecting points.

17. A SAW filter circuit comprising:
a first circuit having,
first to fourth connecting points,
a first SAW resonator being electrically connected to said first and second connecting points,
a second SAW resonator being electrically connected to said first and third connecting points, and
a third SAW resonator being electrically connected to said second and fourth connecting points; and
a second circuit having,
a fifth connecting point being electrically connected to said third connecting point,
a sixth connecting point being electrically connected to said fourth connecting point,
seventh and eighth connecting points being electrically short-circuited,
a first passive element comprising a capacitor and electrically connected to said fifth and sixth connecting points, the capacitance value of said first passive element contained within a range of 9.5 pF to 130 pF,
a second passive element comprising an inductor and electrically connected to said fifth and seventh connecting points, the inductance value of said second passive element contained within a range of 0.25 nH to 2.0 nH, and
a third passive element comprising a capacitor and electrically connected to said sixth and eighth connecting points, the capacitance value of said third passive element contained within a range of 100 pF to 700 pF.

18. The SAW filter circuit according to claim 17, wherein said second passive element is made of one or more bonding wires or one or more strip lines.

19. The SAW filter circuit according to claim 17, wherein each of said first and third passive elements is an MIM capacitor or a chip capacitor.

20. The SAW filter circuit according to claim 17, wherein said first circuit further includes,
ninth and tenth connecting points,
a fourth SAW resonator electrically connected to said first and ninth connecting points, and
a fifth SAW resonator electrically connected to said second and tenth connecting points.

21. A SAW filter circuit comprising:
a first circuit having,
first to fourth connecting points,
a first SAW resonator being electrically connected to said first and second connecting points,
a second SAW resonator being electrically connected to said first and third connecting points, and
a third SAW resonator being electrically connected to said second and fourth connecting points; and
a second circuit having,
a fifth connecting point being electrically connected to said third connecting point,
a sixth connecting point being electrically connected to said fourth connecting point,
seventh and eighth connecting points being electrically short-circuited,
a first passive element comprising an inductor and electrically connected to said fifth and sixth connecting points, the inductance value of said first passive element contained within a range of 0.05 nH to 0.15 nH,
a second passive element comprising an inductor and electrically connected to said fifth and seventh connecting points, the inductance value of said second passive element contained within a range of 0.3 nH to 2.0 nH, and
a third passive element comprising a capacitor and electrically connected to said sixth and eighth connecting points, the capacitance value of said third passive element contained within a range of 1.5 pF to 90 pF.

22. The SAW filter circuit according to claim 21, wherein each of said first and second passive elements is made of one or more bonding wires or one or more strip lines.

23. The SAW filter circuit according to claim 21, wherein said third passive element is an MIM capacitor or a chip capacitor.

24. The SAW filter circuit according to claim 21, wherein said first circuit further includes,
ninth and tenth connecting points,
a fourth SAW resonator electrically connected to said first and ninth connecting points, and
a fifth SAW resonator electrically connected to said second and tenth connecting points.

* * * * *